US010081494B2

(12) United States Patent
Yoshioka et al.

(10) Patent No.: US 10,081,494 B2
(45) Date of Patent: Sep. 25, 2018

(54) CONTAINER TRANSPORT DEVICE AND CONTAINER TRANSPORT FACILITY

(71) Applicant: Daifuku Co., Ltd., Osaka-shi (JP)

(72) Inventors: Hideo Yoshioka, Shiga (JP); Takafumi Yamazaki, Shiga (JP)

(73) Assignee: Daifuku Co., Ltd., Osaka-shi (JP)

( * ) Notice: Subject to any disclaimer, the term of this patent is extended or adjusted under 35 U.S.C. 154(b) by 241 days.

(21) Appl. No.: 15/151,696

(22) Filed: May 11, 2016

(65) Prior Publication Data

US 2016/0336209 A1    Nov. 17, 2016

(30) Foreign Application Priority Data

May 14, 2015   (JP) .................................. 2015-098947

(51) Int. Cl.
*H01L 21/677* (2006.01)
*B65G 35/00* (2006.01)
*H01L 21/673* (2006.01)

(52) U.S. Cl.
CPC .......... *B65G 35/00* (2013.01); *H01L 21/6773* (2013.01); *H01L 21/67379* (2013.01); *H01L 21/67727* (2013.01); *H01L 21/67736* (2013.01); *H01L 21/67775* (2013.01)

(58) Field of Classification Search
None
See application file for complete search history.

(56) References Cited

U.S. PATENT DOCUMENTS

| 8,708,137 | B2 * | 4/2014 | Yoshioka | ............... B65G 25/06 |
| 9,142,437 | B2 * | 9/2015 | Fosnight | ........... H01L 21/67775 |
| 9,685,361 | B2 * | 6/2017 | Yoshioka | .......... H01L 21/67769 |
| 2003/0059284 | A1 | 3/2003 | Inui | |

FOREIGN PATENT DOCUMENTS

JP            200372917 A        3/2003

* cited by examiner

*Primary Examiner* — Mark C Hageman
(74) *Attorney, Agent, or Firm* — The Webb Law Firm

(57) ABSTRACT

A support member includes a first positioning portion for properly positioning a small container, and a second positioning portion for properly positioning a large container. The first positioning portion includes one or more first support members for supporting the small container, and first engaging members for engaging first engaged portions. The second positioning portion includes one or more second support members for supporting the large container at a height at which the bottom surface of the large container is located at a higher position than the upper ends of the first engaging members, a second engaging member provided outside the first supporting area for engaging a second engaged portion, and one or more contact members provided outside the first supporting area for contacting the large container from one or more sides.

4 Claims, 11 Drawing Sheets

CONTAINER TRANSPORT DEVICE AND CONTAINER TRANSPORT FACILITY

CROSS-REFERENCE TO RELATED APPLICATION

This application claims priority to Japanese Patent Application No. 2015-098947 filed May 14, 2015, the disclosure of which is hereby incorporated in its entirety by reference.

FIELD OF THE INVENTION

The present invention relates to a container transport device comprising a support member for supporting from below a container for holding one or more semiconductor substrates, and a moving mechanism for moving the support member. The invention also relates to a container transport facility having such a container transport device.

BACKGROUND

An example of container transport devices such as one described above is disclosed in JP Publication of Application No. 2003-072917 (Patent Document 1). The container transport devices of Patent Document 1 are used to carry containers into, and out of, a storage facility for storing containers. And each container transport device includes a support member (vertically movable member 142) for supporting from below a container for holding semiconductor substrates. Three engaged portions (fitting engagement portions 8) are formed in the bottom surface of each container. And the support member has three positioning pins for engaging the engaged portions provided in the bottom surface of the container. The vertically movable member is configured to support a container with the container positioned in a supporting area by supporting the container from below with the three positioning pins engaged with the three engaged portions of the container.

Conventionally, FOUPs (Front Opening Unified Pod) specified by the SEMI (Semiconductor Equipment and Materials International) standards are often used as containers for holding semiconductor substrates. And the mainstream semiconductor substrates (wafers) held or carried by such containers used to be disk shaped substrates having a diameter of 300 mm. For this reason, the vertically movable member of the container transport device of Patent Document 1 described above has positioning pins that are so located to engage the three engaged portions formed in the FOUPs for semiconductor substrates having a diameter of 300-mm (referred to hereinafter as 300-mm FOUPs).

More recently, however, larger-sized semiconductor substrates (for example, disk-shaped semiconductor substrates of 450 mm in diameter) have been manufactured, in part, to improve productivity. Thus, it has become necessary for container transport devices to be able to transport large containers which are containers for holding larger-sized semiconductor substrates (for example, containers for 450-mm semiconductor substrates having a shape specified by the SEMI standards (referred hereinafter as 450-mm FOUPs)), in addition to the small containers (for example, above-mentioned 300-mm FOUPs) which are containers for holding smaller semiconductor substrates.

The aforementioned SEMI standards require that three groove-shaped engaged portions be formed in the bottom surface for both the 300-mm FOUPs and the 450-mm FOUPs. To be more specific, the bottom surface of a FOUP has three groove-shaped engaged portions, which are formed in the bottom surface of the container such that their longitudinal directions extend radially away from a reference position of the bottom surface of the container. And each of the separation distances between the reference position and each of the three engaged portions (referred to as second engaged portions) for the 450-mm FOUP is greater than the greatest of the separation distances between the reference position and each of the three engaged portions (referred to as the first engaged portions) for the 300-mm FOUP.

SUMMARY OF THE INVENTION

Incidentally, providing both a support member for 300-mm FOUPs and a support member for 450-mm FOUPs separately to the same container transport device would lead to a cost increase; thus, it would be desirable to have one support member functioning as both a support member for 300-mm FOUPs and a support member for 450-mm FOUPs.

However, as described above, the positions of the three first engaged portions in a 300-mm FOUP are different from the positions of the three second engaged portions in a 450-mm FOUP. Thus, any attempt to support a 450-mm FOUP with a support member for 300-mm FOUPs would result in the positioning pins (positioning pins for 300-mm FOUPs) provided in the support member interfering with the bottom surface of the 450-mm FOUP; thus, the support member would not be able to properly support a 450-mm FOUP. In addition, if positioning pins for 450-mm FOUPs are provided at positions in a support member that are suitable for engaging the three engaged portions formed in a 450-mm FOUP, then an attempt to support a 300-mm FOUP with that support member would result in the positioning pins for 450-mm FOUPs interfering with the bottom surface of the 300-mm FOUP; thus, the support member would not be able to properly support a 300-mm FOUP.

Therefore, when the positions of the three engaged portions formed in the bottom surfaces are different between the small container and the large container, the small container and large container cannot be properly supported by one support member used for both the smaller container and the larger container.

Thus, a container transport device and a container transport facility are desired which can properly support both a small container and a large container with one support member that can be used for both small and large containers.

The characteristic arrangement of a container transport device, comprising a support member for supporting from below a container for holding one or more semiconductor substrates, and a moving mechanism for moving the support member, is that the container is one of at least two kinds of containers that include a small container and a large container which is larger in size than the small container as seen along a vertical direction, wherein the small container includes three first engaged portions provided in a bottom surface of the small container with each first engaged portion having a shape of a groove, and wherein the large container includes three second engaged portions provided in a bottom surface of the large container with each second engaged portion having a shape of a groove, wherein each of the three first engaged portions is formed in the bottom surface of the small container such that a longitudinal direction thereof extends radially away from a first reference position on the bottom surface of the small container, wherein each of the three second engaged portions is formed in the bottom surface of the large container such that a longitudinal direction thereof extends radially away from a second reference position on the bottom surface of the large container, wherein each of separation distances between each of the three second engaged portions and the second reference position is greater than a greatest of separation distances between each of the three first engaged portions and the first reference position, wherein the support member includes a first positioning portion for properly positioning the small container supported by the support member in a first supporting area as seen along the vertical direction, and a second positioning portion for properly positioning the large container supported by the support member in a second supporting area as seen along the vertical direction, wherein the second supporting area is defined such that a portion thereof overlaps with the first supporting area, wherein the first positioning portion includes one or more first support members for supporting the small container from below, and first engaging members for engaging from below at least two of the three first engaged portions, wherein the second positioning portion includes one or more second support members for supporting the large container at a height at which the bottom surface of the large container is located at a higher position than upper ends of the first engaging members, and a second engaging member provided outside the first supporting area as seen along the vertical direction for engaging one of the three second engaged portions, and one or more contact members provided outside the first supporting area as seen along the vertical direction for contacting the large container located in the second supporting area from one or more directions that cross the vertical direction.

With the arrangement described above, the small container supported by the support member is properly positioned in the first supporting area by the first positioning portion as seen along the vertical direction and the large container supported by the support member is properly positioned in the second supporting area by the second positioning portion as seen along the vertical direction. Since the second supporting area is defined such that a portion thereof overlaps with the first supporting area, the support member can be made smaller compared with a case where the first supporting area and the second supporting area are arranged next to each other horizontally so as not to overlap with each other.

Because the small container supported by the support member is supported from below by the one or more first support members while the first engaging members engage at least two of the three first engaged portions of the small container, the small container can be supported by the support member with the small container properly positioned in the first supporting area.

And because the large container supported by the support member is supported by one or more second support members of the second positioning portion at a height at which the bottom surface of the large container is located at a higher position than the upper ends of the first engaging members, the large container can be properly supported by the support member without the large container interfering with, or coming into contact with, the first engaging members.

In addition, the large container supported by the support member can be properly positioned in the second supporting area by virtue of the fact that the second engaging member engages one of the three second engaged portions of the large container and the fact that the one or more contact members contact the large container from one or more directions that cross the vertical direction. Particularly, with the one or more contact members contacting the large container from one or more directions that cross the vertical direction, the large container can be restricted or prevented from rotating about a vertical axis centering on the second engaged portion.

And because the second engaging member is located outside the first supporting area, the second engaging member can be prevented from interfering with, or coming into contact with, a small container when supporting the small container with the support member, allowing the small container to be properly supported by the support member.

Thus, both a small container and a large container can be properly supported by one support member used to support both small and large containers.

DETAILED DESCRIPTION

Embodiments of a container transport facility having a container transport device are described next with reference to the attached drawings.

Figure 1:
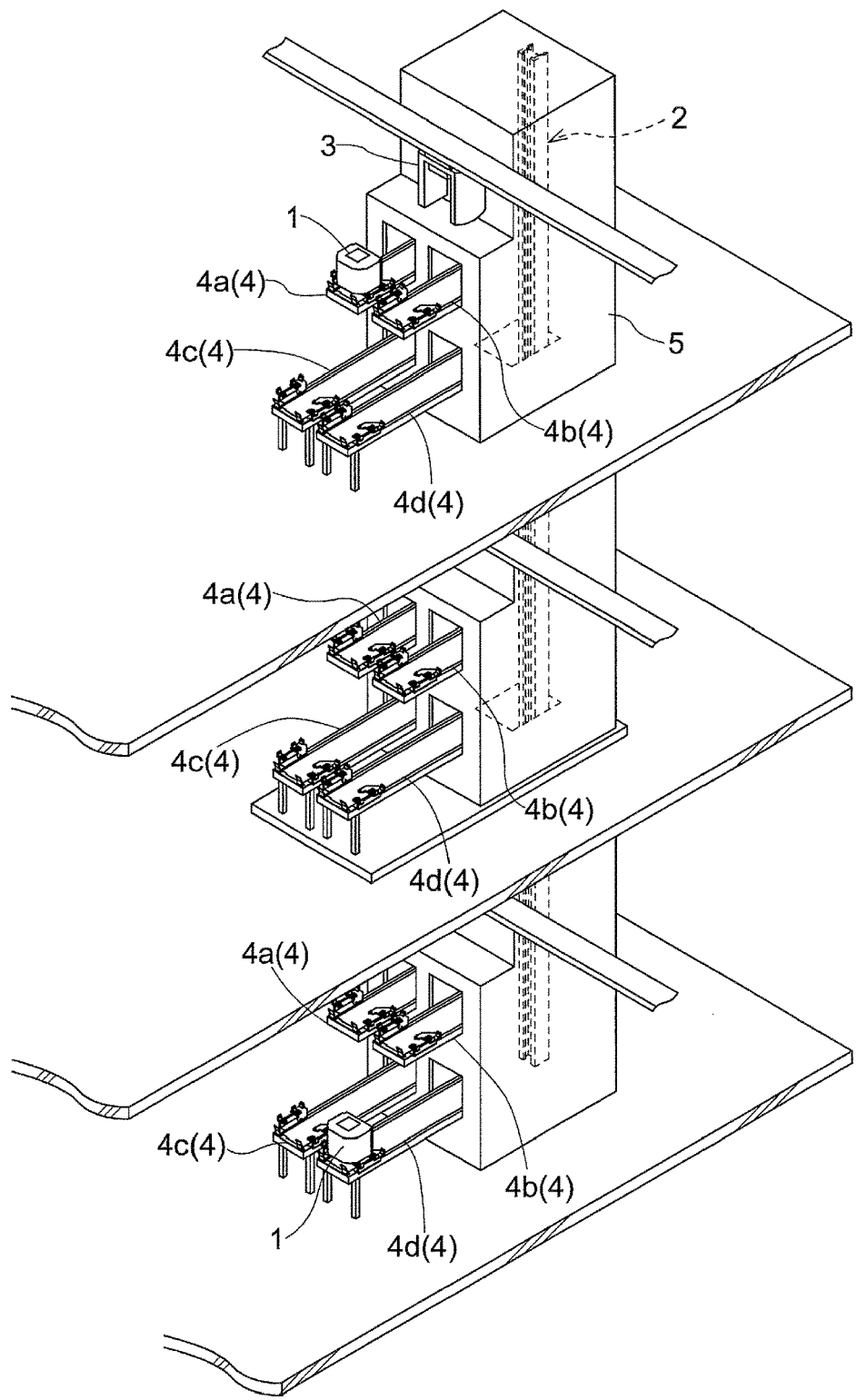
FIG. 1 is a perspective view showing a principal part of a container transport facility.

As shown in FIG. 1, the container transport facility includes a raising-and-lowering transport device 2 for transporting containers 1 one container 1 at a time among a plurality of floors, a ceiling or overhead transport vehicle 3 for traveling near the ceiling to transport containers 1 one container 1 at a time, and container transport devices 4 each of which is for transporting containers 1 one container 1 at a time with the container transport device 4 supporting the container 1 from below.

Note that each container 1 is for holding or carrying semiconductor substrates, and is a FOUP (Front Opening Unified Pod) specified by the SEMI standards.

Figure 2:
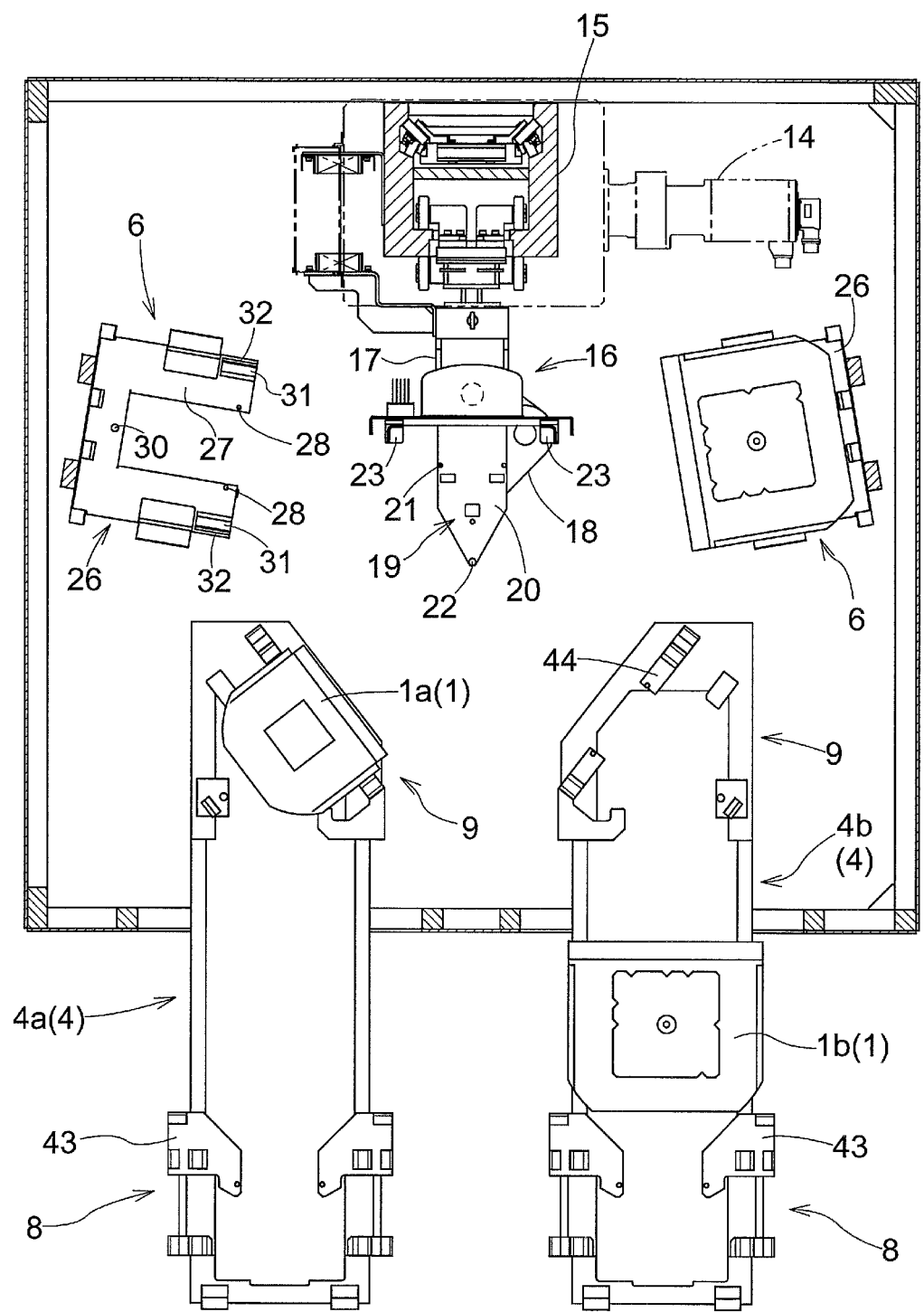
FIG. 2 is a plan view showing a raising-and-lowering transport device and container transport devices.
Figure 3:
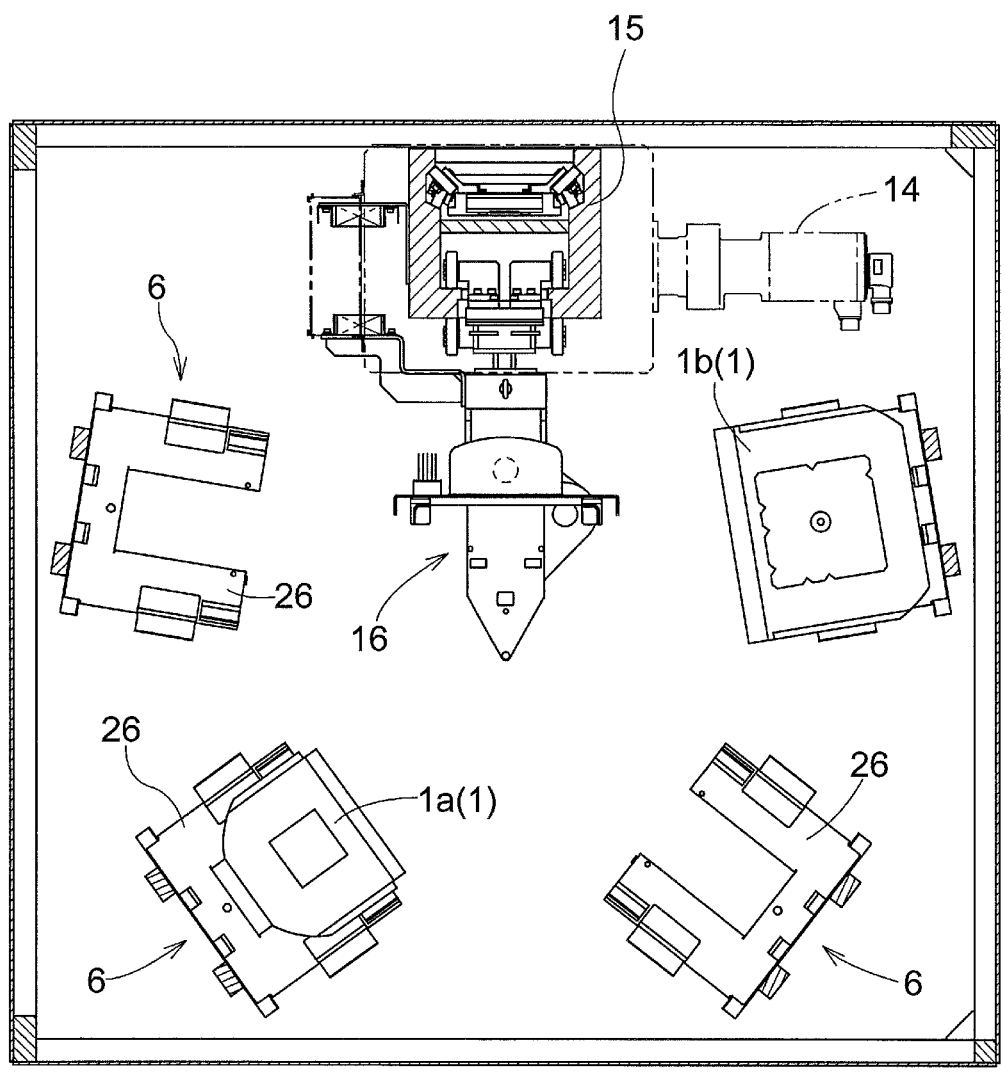
FIG. 3 is a plan view showing the raising-and-lowering transport device and storage sections.

The raising-and-lowering transport device 2 is located inside the tubular member 5. The ceiling transport vehicle 3 is located outside the tubular member 5. Each container transport device 4 is arranged to extend from inside of the tubular member 5 to outside thereof. As shown in FIGS. 2 and 3, storage sections 6 for storing containers 1 are provided within the tubular member 5.

In this container transport facility, when a container 1 is placed at an outside location 8 of a container transport device 4 by the ceiling transport vehicle 3 or a worker, the container 1 is transported from the outside location 8 to an inside location 9 by the container transport device 4, and is subsequently transported to one of the storage sections 6 from the inside location 9 by the raising-and-lowering transport device 2 to store the container 1 in the storage section 6.

In addition, a container 1 stored in a storage section 6 is transported from the storage section 6 to the inside location 9 of one of the container transport devices 4 by the raising-and-lowering transport device 2, and is subsequently supported and transported from the inside location 9 to the outside location 8 by the container transport device 4. The container 1 at the outside location 8 is picked up from the outside location 8 by the ceiling transport vehicle 3 or a worker.

Note that containers 1 are sometimes transported from one inside location 9 to another inside location 9 by the raising-and-lowering transport device 2.

[Container]

The container 1 is described in more detail next.

An opening for taking semiconductor substrates in and out of the container 1 is formed in the container 1. The portion of the container 1 in which the opening is formed is defined to be the front portion of the container 1 whereas the portion of the container 1 opposite from the front portion is defined to be the back portion of the container 1. And the direction along which the front portion and the back portion of the container 1 are spaced apart from each other is defined to be the fore and aft direction of the container 1. In addition, the direction which is perpendicular to the fore and aft direction of the container 1 as seen along the vertical direction is defined to be the right and left direction of the container 1.

Figure 5:
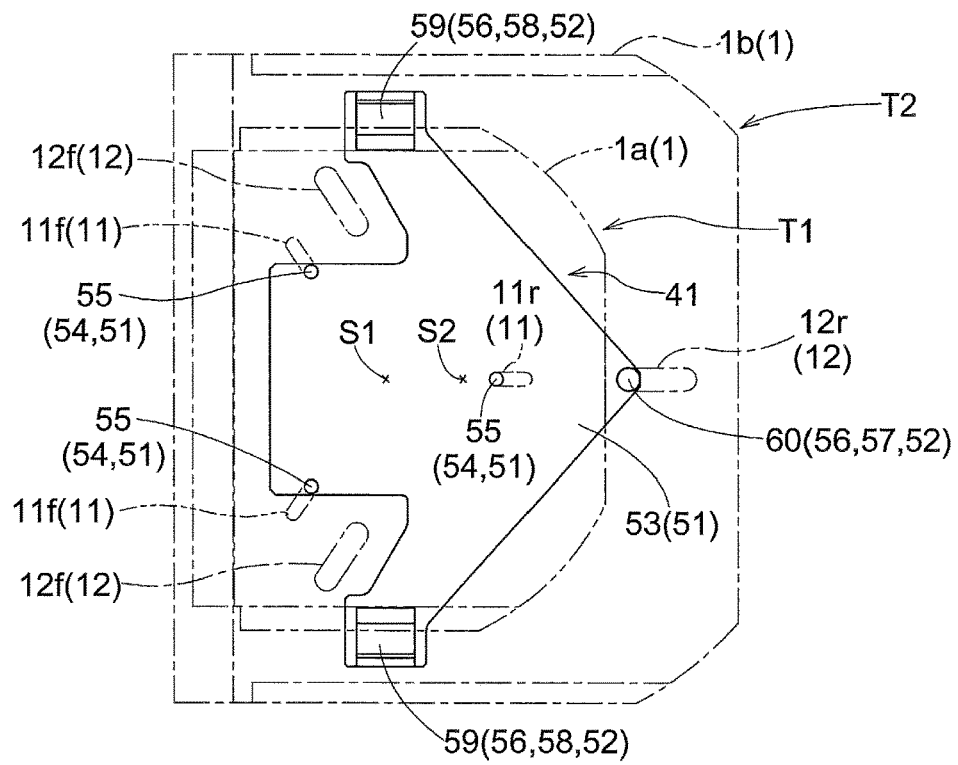
FIG. 5 is a plan view of a support member.

As shown in FIGS. 2 and 3, and also in FIG. 5 with phantom lines, the container 1 can be either a small container 1a, or a large container 1b which is larger in size than the small container 1a as seen along the vertical direction (in plan view). Note that the terms, the "small container" and "large container" are not used to indicate their absolute dimensions and are used to indicate their relative sizes in that a small container is smaller in size than a large container in plan view, etc.

The small container 1a may be a FOUP specified by the SEMI standards (E47.1), and may be a FOUP for storing semiconductor substrates that are 300 mm in diameter. The large container 1b may be a FOUP specified by SEMI standards (E158), and may be a FOUP for storing semiconductor substrates that are 450 mm in diameter.

As shown in FIGS. 5-15 with phantom lines, each small container 1a has three groove-shaped first engaged portions 11 in the bottom surface. Each of the three first engaged portions 11 is formed in the bottom surface of the small container 1a such that its longitudinal direction extends radially away from a first reference position S1 on the bottom surface of the small container 1a.

As the three first engaged portions 11, the small container 1a has a pair of right and left front side first engaged portions 11f located forward of the first reference position S1, and one back side first engaged portion 11r which is located rearward of the first reference position S1 and in the central area, along the right and left direction, of the small container 1a.

Each large container 1b has three groove-shaped second engaged portions 12 in the bottom surface. Each of the three second engaged portions 12 is formed in the bottom surface of the large container 1b such that its longitudinal direction extends radially away from a second reference position S2 on the bottom surface of the large container 1b.

As the three second engaged portions 12, the large container 1b has a pair of right and left front side second engaged portions 12f located forward of the second reference position S2, and one back side second engaged portion 12r which is located rearward of the second reference position S2 and in the central area, along the right and left direction, of the large container 1b.

Each of the separation distances between each of the three second engaged portions 12 and the second reference position S2 is greater than the greatest of the separation distances between each of the three first engaged portions 11 and the first reference position S1.

[Raising and Lowering Transport Device]

As shown in FIGS. 2 and 3, the raising-and-lowering transport device 2 includes a raised-and-lowered platform 16 which is vertically moved, or raised and lowered, along a guide rail 15 by a raising-and-lowering motor 14. The raised-and-lowered platform 16 includes a raised-and-lowered main body 17, a linkage 18, and a raised-and-lowered support member 19.

The base portion of the linkage 18 is rotatably connected to the raised-and-lowered main body 17 for pivoting movement about a vertical pivot axis whereas the distal end portion of the linkage 18 is connected to the raised-and-lowered support member 19. And the raised-and-lowered platform 16 can be switched, by extending and contracting the linkage 18, between a state in which the raised-and-lowered support member 19 is retracted to a position on or above the raised-and-lowered main body 17 and a state in which the raised-and-lowered support member 19 is projected toward a storage section 6 or the inside location 9. In addition, the raised-and-lowered platform 16 is configured to be able to change, by pivoting the linkage 18 about the pivot axis, a projecting and retracting direction of the raised-and-lowered support member 19 when extending and contracting the linkage 18.

The raised-and-lowered support member 19 includes a first plate-shaped support portion 20 and three first engaging portions 21 which project upwardly from the first support portion 20. The raised-and-lowered support member 19 supports a small container 1a from below by means of the first support portion 20 with the small container 1a properly positioned along horizontal directions by virtue of the fact that the three first engaging portions 21 engage from below the three first engaged portions 11 of the small container 1a.

In addition, the raised-and-lowered support member 19 includes one second engaging portion 22 which projects upwardly from the first support portion 20, and a pair of second support portions 23 which support the large container 1b from below and contact the large container 1b from the front and from right and left. The raised-and-lowered support member 19 supports a large container 1b from below by means of the second engaging portion 22 and the pair of second support portions 23 with the large container 1b properly positioned along horizontal directions by virtue of the fact that the second engaging portion 22 engage the back side second engaged portion 12r of the large container 1b from below and the second support portions 23 are in contact with the side faces of the large container 1b.

[Storage Section]

Each storage section 6 includes a storage support member 26 for supporting a container 1 from below.

The storage support member 26 includes a plate-shaped third support portion 27, and two third engaging portions 28 which project upwardly from this third support portion 27.

The storage support member 26 supports a small container 1a from below by means of the support portion 27 with the small container 1a properly positioned along the horizontal directions by virtue of the fact that the two third engaging portions 28 engage the two front side first engaged portions 11f of the small container 1a from below.

In addition, the storage support member 26 includes one fourth engaging portion 30 which projects upwardly from the third support portion 27, a pair of fourth support portions 31 which support a large container 1b from below, and two contact portions 32 for contacting the large container 1b from right and left. The storage support member 26 supports a large container 1b from below by means of the fourth engaging portion 30 and the pair of fourth support portions 31 with the large container 1b properly positioned along horizontal directions by virtue of the fact that the fourth engaging portion 30 engage the back side second engaged portion 12r of the large container 1b from below and the fact that the contact portions 32 are in contact with the right and left side faces of the large container 1b.

[Container Transport Device]

The container transport devices 4 are described next.

As shown in FIGS. 1 and 2, four kinds of container transport devices 4 are provided, namely, a first container transport device 4a, a second container transport device 4b, a third container transport device 4c, and a fourth container transport device 4d.

The first container transport device 4a is used as a carry-in container transport device 4 for transporting containers 1, one container 1 at a time, from a first receiving member 43 (the outside location 8) to a second receiving member 44 (the inside location 9). The second container transport device 4b is used as a carry-out container transport device 4 for transporting containers 1, one container 2 at a time, from its second receiving member 44 (the inside location 9) to its first receiving member 43 (the outside location 8).

Figure 15:
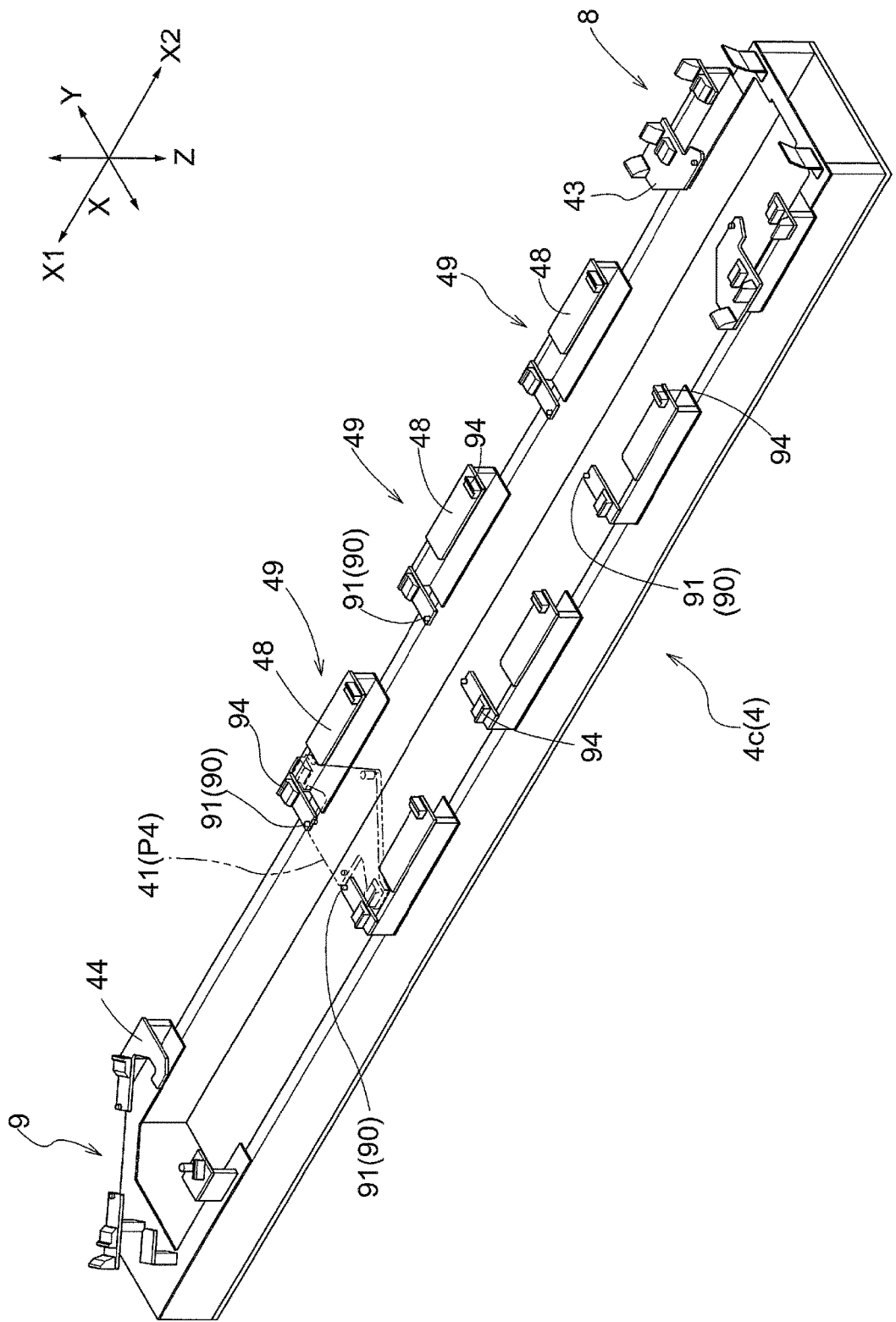
FIG. 15 is a perspective view of a third container transport device.

The third container transport device 4c is used as a carry-in container transport device 4 as in the case of the first container transport device 4a, and has buffer locations 49 for temporarily storing containers 1 (see FIG. 15). The fourth container transport device 4d is used as a carry-out container transport device 4 as in the case of the second container transport device 4b, and has buffer locations 49 for temporarily storing containers 1.

As such, each container transport device 4 is configured to transport containers 1, one at a time, from its first receiving member 43 to its second receiving member 44, or from its second receiving member 44 to its first receiving member 43.

And, as shown in FIG. 1, the first container transport device 4a and the second container transport device 4b are located at the same height. The third container transport device 4c and the fourth container transport device 4d are located at the same height and at a lower height than the first and second container transport devices 4a, 4b.

And the first receiving members 43 provided to the first container transport device 4a and the second transport container transport device 4b are arranged to allow the ceiling transport vehicle 3 to transfer a container 1 to or from the first receiving members 43. And the first receiving members 43 provided to the third container transport device 4c and the fourth transport container transport device 4d are arranged to allow a worker or a floor surface transport vehicle which travels on the floor surface to transfer a container 1 to or from the first receiving members 43.

Figure 4:
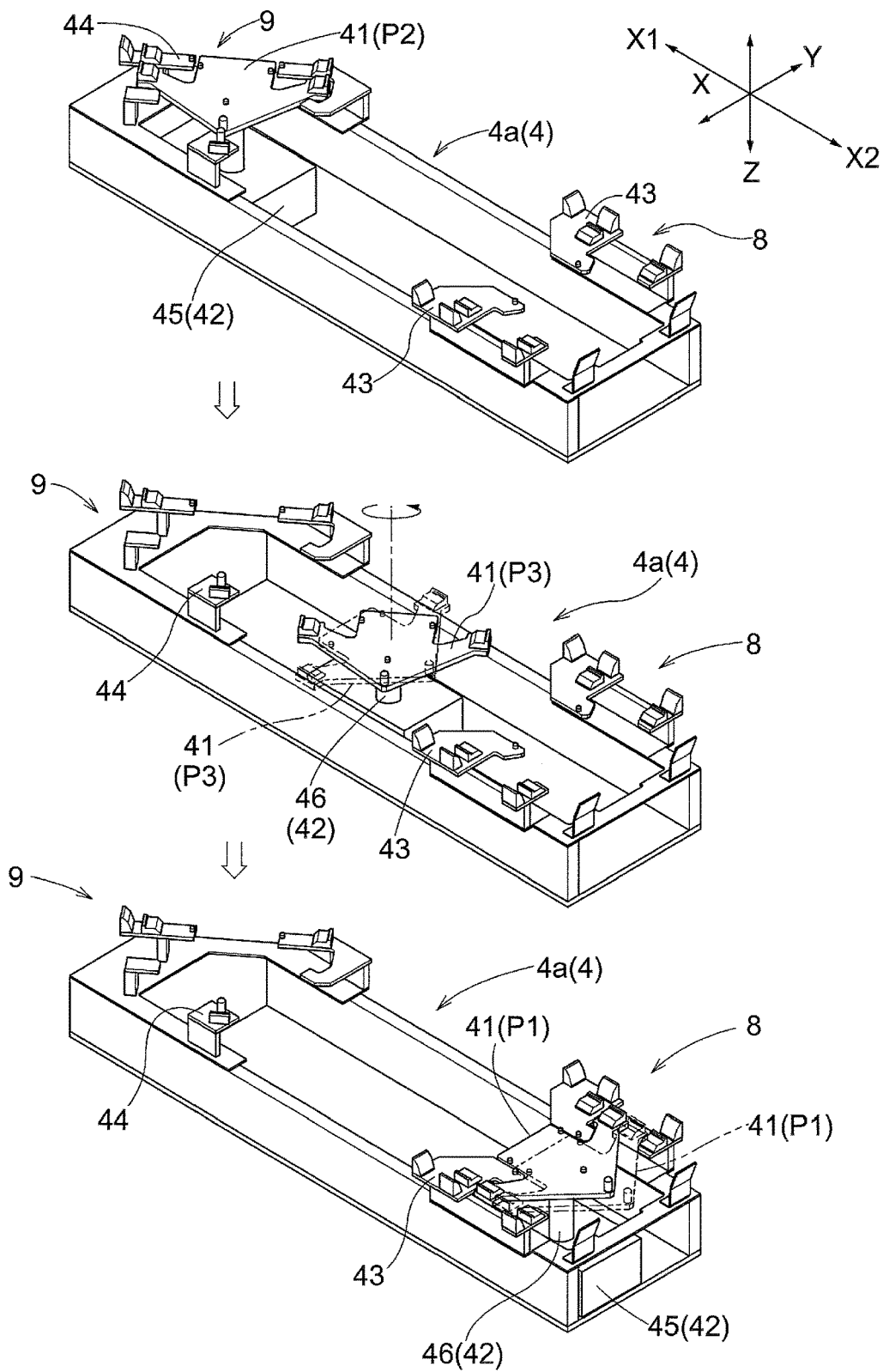
FIG. 4 is explanatory drawing showing how the first container transport device operates.

Common features and structures among the four kinds of container transport devices 4 are described first with descriptions of features and structures specific to one or more kinds of the container transport devices 4 provided where appropriate. Note that FIG. 4 shows the first container transport device 4a as an example.

Each container transport device 4 includes a support member 41 for supporting a container 1 from below, a moving mechanism 42 for moving a support member 41 along a first moving direction X and along a second moving direction Z, and a rotating mechanism (not shown) for rotating a support member 41 about a vertical axis extending along the vertical direction. Each container transport device 4 also includes a first receiving member 43 whose position is fixed at the outside location 8 to support a container 1 from below as well as a second receiving member 43 whose position is fixed at the inside location 9 to support a container 1 from below.

The moving mechanism 42 includes a first moving mechanism 45 for moving the support member 41 along the first moving direction X which extends along a horizontal direction, and a second moving mechanism 46 for moving the support member 41 along the second moving direction Z which extends along the vertical direction. As shown in FIG. 4, the direction, along the first moving direction X, in which the second receiving member 44 is located with respect to the first receiving member 43 (i.e., a direction along the first moving direction X that points toward the second receiving member 44 from the first receiving member 43) will be referred to as the first direction X1 whereas the opposite direction of the first direction X1 will be referred to as the second direction X2.

The first moving mechanism 45 is a movable carriage which can travel back and forth along a straight travel path defined along the first moving direction X, and is configured to move the support member 41 along the first moving direction X by traveling along the first moving direction X.

The second moving mechanism 46 is a cylinder device supported by the first moving mechanism 45. And the support member 41 is fixed to the top end of the second moving mechanism 46. And the second moving mechanism 46 is configured to move the support member 41 along the second moving direction Z by extending and contracting along the vertical direction.

The second moving mechanism 46 is configured to vertically move, or raise and lower, the support member 41 to an occupied moving height and to a non-occupied moving height by moving the support member 41 along the second moving direction Z.

The non-occupied moving height is defined to be such a height that the support member 41 is located at a lower height than the first receiving member 43 and the second receiving member 44, and is defined to be such a height that the support member 41 does not interfere with, or come into contact with, either the first receiving member 43 or the second receiving member 44 when the support member 41 is moved along the first moving direction X at the non-occupied moving height. This non-occupied moving height is the height of the support member 41 when the support member 41 is moved along the first moving direction X with no container 1 supported on the support member 41.

The occupied moving height is defined to be such a height that the support member 41 is located at a greater height than the first receiving member 43 and the second receiving member 44, and is defined to be such a height that the support member 41 does not interfere with, or come into contact with, either the first receiving member 43 or the second receiving member 44 when the support member 41 is moved along the first moving direction X at the occupied moving height. This occupied moving height is the height of the support member 41 when the support member 41 is moved along the first moving direction X with a container 1 supported on the support member 41.

Note that, in FIG. 4, the support member 41 is shown to be located at an intermediate height between the occupied moving height and the non-occupied moving height in the container transport device 4 shown on the upper side and the container transport device 4 shown on the lower side; and, the support member 41 is shown to be located at the same height as the first receiving member 43 and the second receiving member 44. In addition, in the container transport device 4 shown in the middle of FIG. 4, the support member 41 is shown to be located at the non-occupied moving height.

As shown in FIG. 4, the first moving mechanism 45 is configured to horizontally move the support member 41 to a first position P1, a second position P2, and a third position P3, by moving the support member 41 along the first moving direction X.

The first position P1 is defined to be the position at which the support member 41 is located, as seen along the vertical direction, when transferring a container 1 between the support member 41 and the first receiving member 43 by moving the support member 41 along the second moving direction Z. In other words, the container 1 can be transferred between the support member 41 and the first receiving member 43 by raising and lowering the support member 41 between the occupied moving height and the non-occupied moving height with the support member 41 located at the first position P1.

The second position P2 is defined to be the position at which the support member 41 is located, as seen along the vertical direction, when transferring a container 1 between the support member 41 and the second receiving member 44 by moving the support member 41 along the second moving direction Z. In other words, the container 1 can be transferred between the support member 41 and the second receiving member 44 by raising and lowering the support member 41 between the occupied moving height and the non-occupied moving height with the support member 41 located at the second position P2.

The third position P3 is defined to be a position between the first position P1 and the second position P2 along the first moving direction X, and is a position at which the support member 41 is rotated by the rotating mechanism about a vertical axis extending along the vertical direction.

As shown in FIG. 4, in the first container transport device 4a used as a carry-in container transport device 4, the support member 41 is rotated clockwise in plan view by a set angle (for example, about 50 degrees) at the third position P3 during the movement of the support member 41 from the first position P1 to the second position P2 at the occupied moving height. And the support member 41 is rotated counterclockwise in plan view by the set angle (for example, about 50 degrees) at the third position P3 during the movement of the support member 41 from the second position P2 to the first position P1 at the non-occupied moving height. Thus, the support member 41 located at the second position P2 has an orientation that is pivoted clockwise, in plan view, with respect to the support member 41 located at the first position P1.

The third container transport device 4c rotates the support member 41 at the third position P3 by the set angle in the same direction as the direction of rotation in the case of the first container transport device 4a; thus, the support member 41 located at the second position P2 has an orientation that is tilted or pivoted clockwise, in plan view, with respect to the support member 41 located at the first position P1.

In the case of the second container transport device 4b and the fourth container transport device 4b, the support member 41 is rotated at the third position P3 by the set angle in the direction opposite from the direction of rotation in the case of the first container transport device 4a; thus, the support member 41 located at the second position P2 has an orientation that is tilted or pivoted counterclockwise, in plan view, with respect to the support member 41 located at the first position P1.

Figure 12:
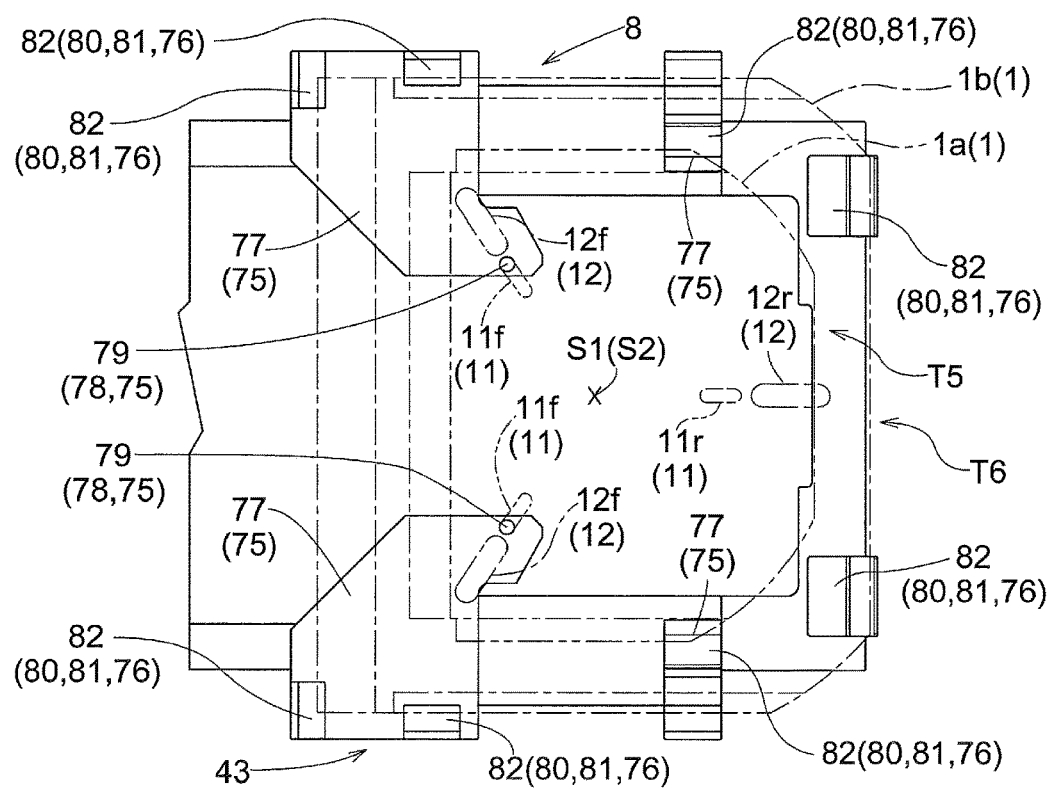
FIG. 12 is a plan view of a first receiving member.

In addition, defined as the first position P1 are: a position for small containers (position shown in FIG. 4 with phantom lines) which is a position of the support member 41 when transferring a small container 1a between the support member 41 and the first receiving member 43; and a position for large containers (position shown in FIG. 4 with solid lines) which is a position of the support member 41 when transferring a large container 1b between the support member 41 and the first receiving member 43. And the position for small containers is defined such that it is displaced in the second direction X2 from the position for large containers. By so displacing the position for small containers in the second direction X2 from the position for large containers, a first reference position S1 for the small container 1a when the small container 1a is lowered onto the first receiving member 43 and a second reference position S2 for the large container 1b when the large container 1b is lowered onto the first receiving member 43 are caused to coincide with each other along the first moving direction X as shown in FIG. 12.

As shown in FIG. 15, in each of the third container transport device 4c and the fourth container transport device 4d, the first moving mechanism 45 is configured to horizontally move the support member 41 to one or more fourth positions P4, in addition to the first position P1, the second position P2, and the third position P3, by moving the support member 41 along the first moving direction X.

One or more fourth positions P4 are defined between the first position P1 and the third position P3 along the first moving direction X. And each fourth position P4 is a position at which the support member 41 is located, as seen along the vertical direction, when transferring a container 1 between the support member 41 and the corresponding one of third receiving members 48 by moving the support member 41 along the second moving direction Z. In other words, the container 1 can be transferred between the support member 41 and any one of the third receiving members 48 by raising and lowering the support member 41 between the occupied moving height and the non-occupied moving height with the support member 41 located at corresponding one of the fourth positions P4.

The support member 41 is described next, in which, with the container 1 being supported by the support member 41, the direction along the fore and aft direction of the container 1 supported by the support member 41 will be referred to as the fore and aft direction of the support member 41 whereas the right and left direction of the container 1 supported by the support member 41 will be referred to as the right and left direction of the support member 41. In addition, with respect to a direction along the fore and aft direction and a direction along the right and left direction, a direction that points toward the reference position of the container 1 supported by the support member 41 will be referred to as an inward direction (or characterized as being inward) whereas a direction opposite from an inward direction will be referred to as an outward direction (or characterized as being outward). In addition, the front side, along the fore and aft direction, of the container 1 is defined to be the front side, along the fore and aft direction of, the support member 41. Note that FIG. 5 is a plan view of the support member 41 as seen along the vertical direction, FIG. 6 is a side view of the support member 41 as seen along the right and left direction, and FIG. 7 is a rear view of the support member 41 as seen along the fore and aft direction.

Figure 6:
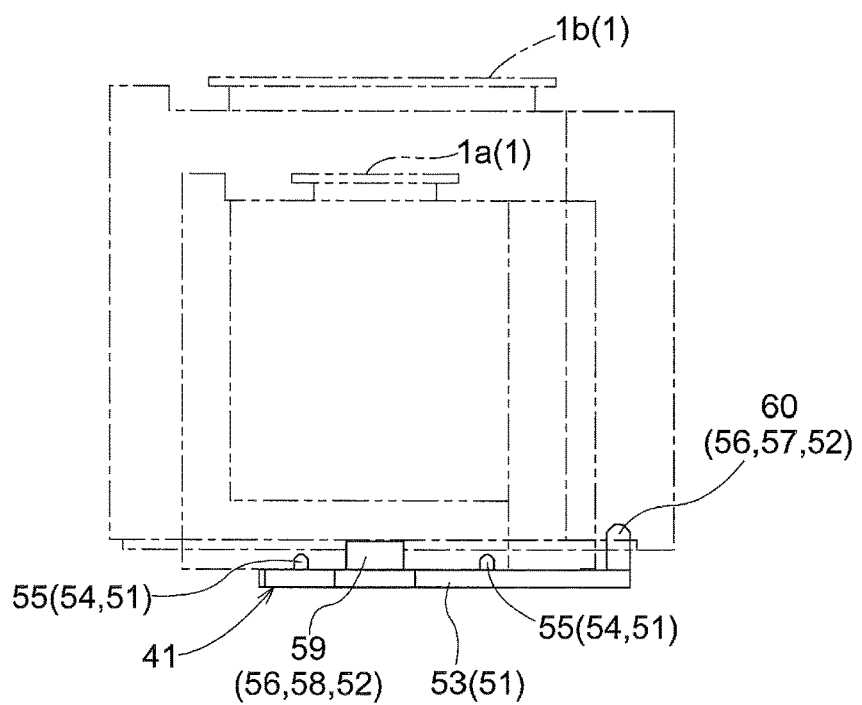
FIG. 6 is a side view of the support member.
Figure 7:
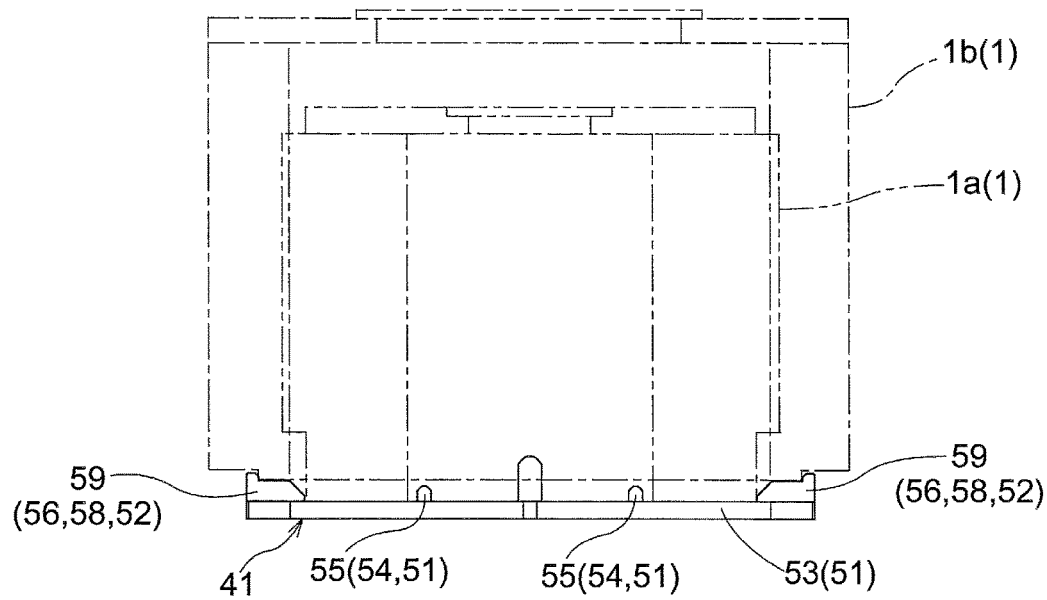
FIG. 7 is a rear view of the support member.

As shown in FIGS. 5-7, the support member 41 includes a first positioning portion 51 for properly positioning a small container 1a supported by the support member 41 in a first supporting area T1 as seen along the vertical direction, and a second positioning portion 52 for properly positioning a large container 1b supported by the support member 41 in a second supporting area T2 as seen along the vertical direction. The second supporting area T2 is defined such that a portion thereof overlaps with the first supporting area T1.

Incidentally, the first supporting area T1 is an area in which the bottom surface of a small container 1a properly positioned by the first positioning portion 51 exists whereas the second supporting area T2 is an area in which the bottom surface of a large container 1b properly positioned by the second positioning portion 52 exists. And the support member 41 supports a container 1 in an orientation in which the front side of the container 1 faces in the first direction X1.

The first positioning portion 51 includes a first support member 53 and first engaging members 54.

The first support member 53 is formed in the shape of a plate, and supports the bottom surface of a small container 1a from below. Three first pins 55 are fixed to the first support member 53 with the first pins 55 projecting upward from the first support member 53. And the three first pins 55 are located within the first supporting area T1. And the three first pins 55 are for engaging from below the three first engaged portions 11 of a small container 1a when supporting the small container 1a with the support member 41, and function as first engaging members 54 for engaging the first engaged portions 11.

The first positioning portion 51 is configured to be able to support a small container 1a with the small container 1a properly positioned in the first supporting area T1 by supporting the small container 1a from below by means of the first support member 53 with the three first pins 55 (first engaging member 54) engaging the three first engaged portions 11 of the small container 1a.

The second positioning portion 52 includes second support members 56, a second engaging member 57, and contact members 58. As shown in FIG. 7, the second support members 56 support a large container 1b at a height at which the bottom surface of the large container 1b is located at a higher position than the upper ends of the first engaging members 54.

First restricting support members 59 are fixed to the top surface of the first support member 53. The first restricting support members 59 are located outside the first supporting area T1 and inside the second supporting area T2, and function as second support members 56 and contact members 58 as described in more detail below. Provided as the first restricting support members 59 are a pair of first restricting support members 59, namely, a first restricting support member 59 located to the right of the first supporting area T1 and a first restricting support member 59 located to the left of the first supporting area T1.

And each member of the pair of the first restricting support members 59 is formed in a shape of a two-step stair. Portions, of the first restricting support members 59, that form the lower steps function as second support members 56 which support from below a large container 1b located in the second supporting area T2. In addition, portions, of the first restricting support members 59, that form the upper steps function as the contact members 58 that contact, from right and left, the large container 1b located in the second supporting area T2. Incidentally, the portions, of the first restricting support members 59, that form the lower steps are located inward (i.e on the side in which the second reference position S2 of the supported large container 1b is located) along the right and left direction with respect to the portions that form the upper steps.

The pair of the first restricting support member 59 are located at the same position relative to each other in the fore and aft direction. And, as shown in FIG. 5, when a large container 1b is supported in the second supporting area T2 by the support member 41, the first restricting support members 59 (some portions of the first restricting support members 59 in the present example) are located rearward of, or displaced rearward relative to, the front side second engaged portions 12f. In addition, when a large container 1b is supported in the second supporting area T2 by the support member 41, the first restricting support members 59 are located forward of, or displaced forward relative to, the back side second engaged portion 12r, and are located forward of the second reference position S2 along the fore and aft direction in the present example. In addition, in the present example, the first restricting support members 59 are located forward of a central portion, along the fore and aft direction, of the large container 1b. As such, the pair of the first restricting support members 59 are arranged to support, from below, both end portions (of the large container 1b) along the right and left direction that are located forward of the central portion along the fore and aft direction. In addition, the pair of the first restricting support members 59 are arranged to contact the large container 1b, from both sides along the right and left direction, at locations forward of the back side second engaged portion 12r (and forward of the central portion of the large container 1b along the fore and aft direction, in the present example).

Incidentally, the portions that form the lower steps in the pair of first restricting support members 59 also function as members that contact, from right and left, a small container 1a located in the first supporting area T1.

A single second pin 60 is fixed to the first support member 53 so as to project upwardly from the first support member 53. And this second pin 60 is located outside the first supporting area T1 and is located inside the second supporting area T2. And when supporting a large container 1b with the support member 41, the second pin 60 supports the large container 1b by engaging, from below, the back side second engaged portion 12r of the large container 1b, and functions as a second support member 56 which supports the large container 1b from below and as a second engaging member 57 which engages the second engaged portion 12.

The second positioning portion 52 is configured to be able to support a large container 1b with the large container 1b properly positioned in the second supporting area T2, by supporting the large container 1b from below by means of the second support members 56 (the second pin 60 and the pair of first restricting support members 59) with the second engaging member 57 (second pin 60) engaging the back side second engaged portion 12r of the large container 1b and with the first restricting support members 59 in contact with the large container 1b from right and left.

To describe the support member 41 (first support member 53) in more detail, the front edge of the support member 41 is formed to be straight, extending along the right and left direction whereas the back end portion of the support member 41 is formed to taper toward its back end with its width along the right and left direction becoming narrower toward the back end along the fore and aft direction.

And when the support member 41 is located at the second position P2, the support member 41 is in such an orientation that the front edge of the support member 41 extends along a spaced-apart direction along which a pair of second restricting support members 71 (described below) are spaced apart from each other (or a direction that is tilted, or pivoted, with respect to the first moving direction X in plan view), and is in such an orientation that one of the edges of the back end portion of the support member 41 extends along the first moving direction X.

Figure 8:
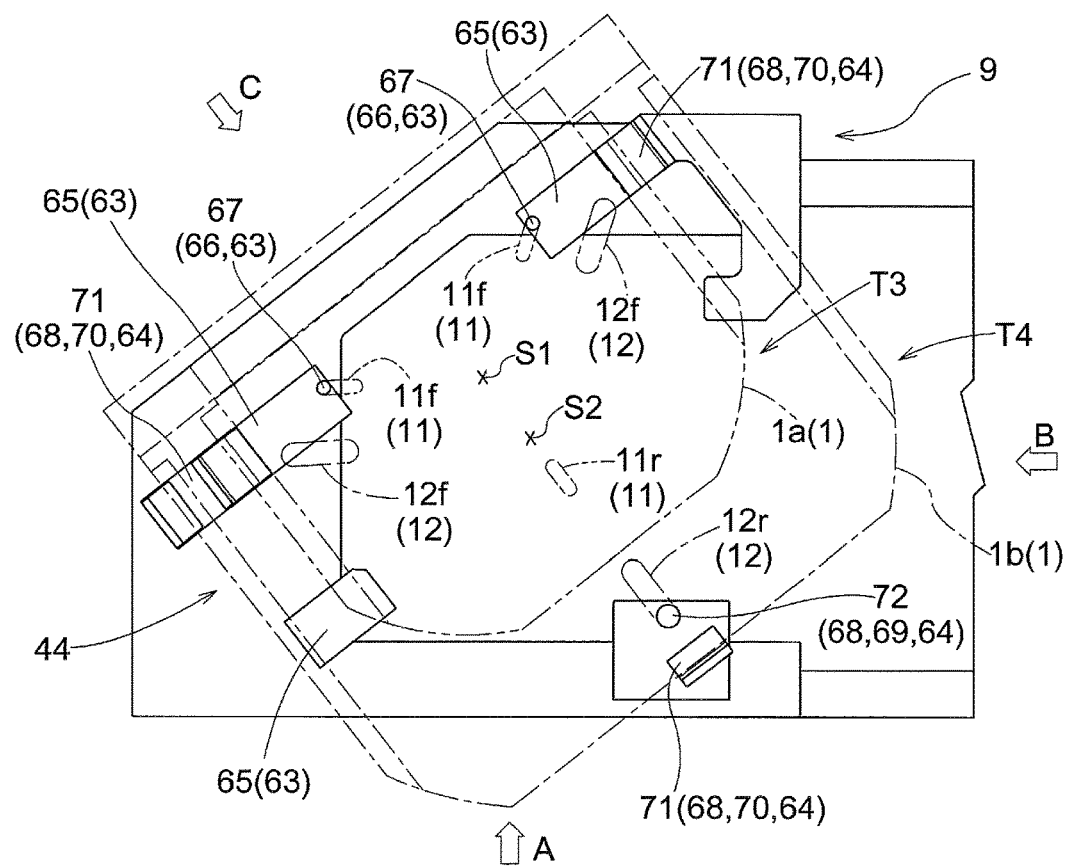
FIG. 8 is a plan view of a second receiving member.
Figure 9:
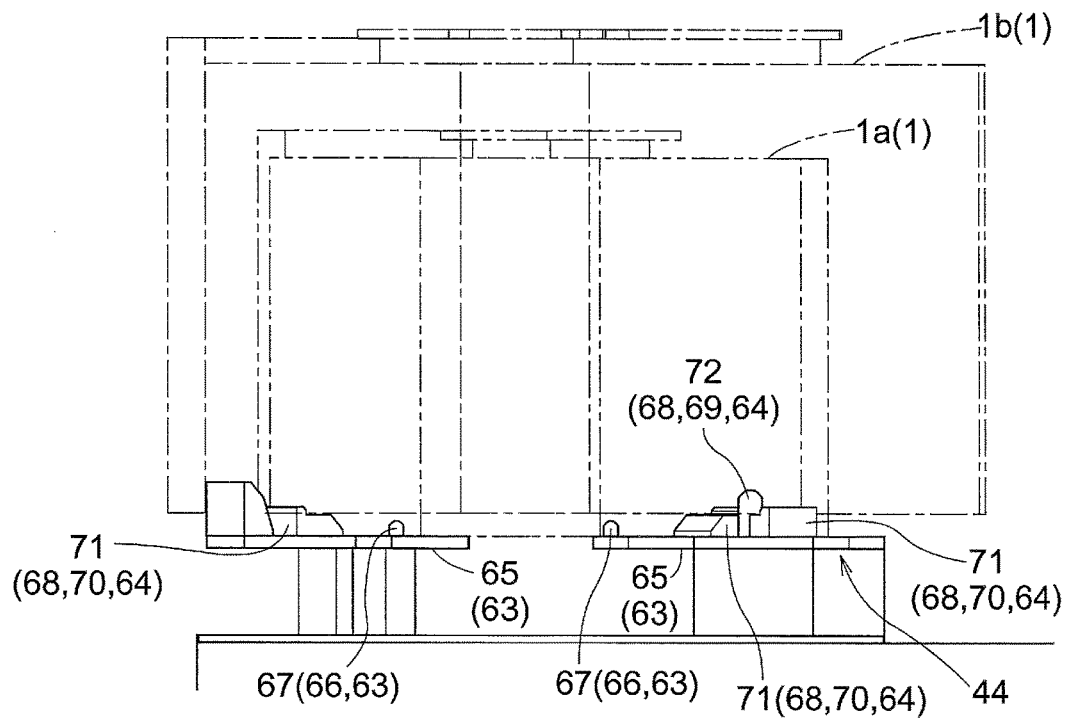
FIG. 9 is a view of the second receiving member as seen along a direction indicated by the arrow A in FIG. 8.
Figure 10:
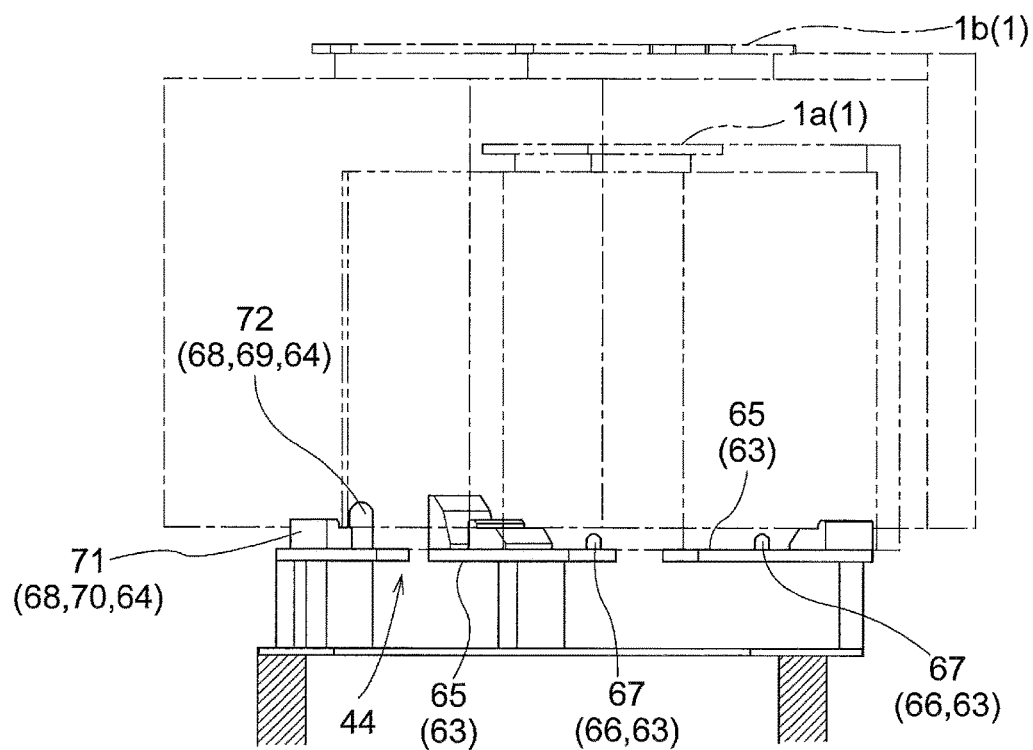
FIG. 10 is a view of the second receiving member as seen along a direction indicated by the arrow B in FIG. 8.
Figure 11:
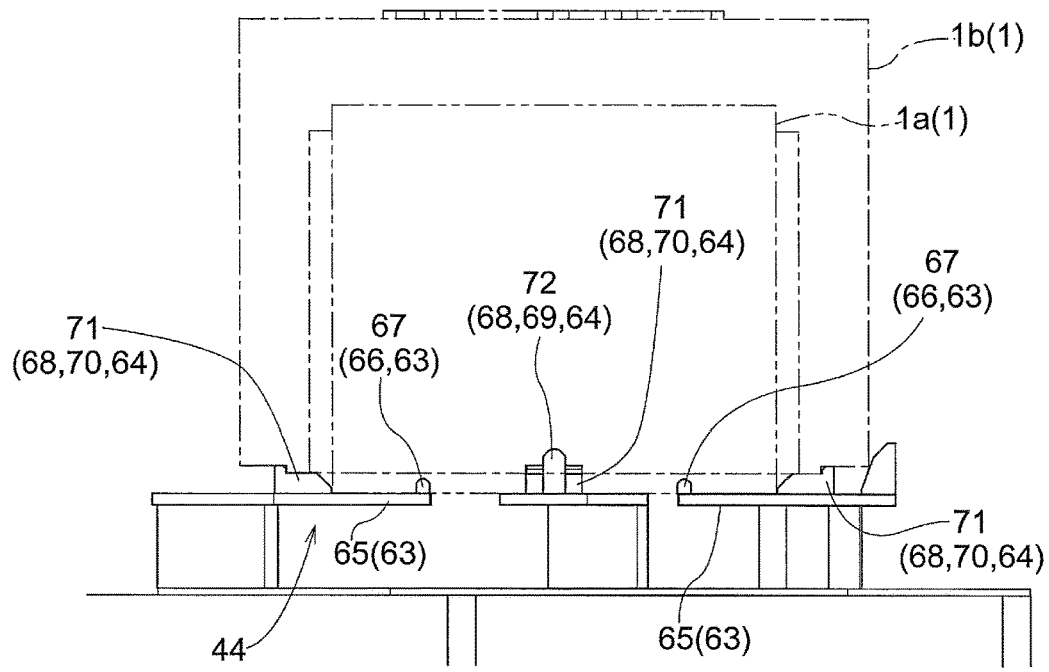
FIG. 11 is a view of the second receiving member as seen along a direction indicated by the arrow C in FIG. 8.

The second receiving member 44 is described next. Note that FIG. 8 is a plan view of the second receiving member 44 as seen along the vertical direction, FIG. 9 is a side view (view as seen along the direction indicated by the arrow A in FIG. 8) of the second receiving member 44, as seen along the width direction Y (horizontal direction perpendicular to the first moving direction X), FIG. 10 is an elevational view (view as seen along the direction indicated by the arrow B in FIG. 8) of the second receiving member 44 as seen along the first moving direction X, and FIG. 11 is an elevational view (view as seen along the direction indicated by the arrow C in FIG. 8) of the second receiving member 44 as seen along the fore and aft direction of the supported container 1. In the following description, the structure and arrangement of the second receiving member 44 is described using the directions (fore and aft direction and right and left direction) that are defined for the support member 41 located at the second position P2. In the present embodiment, as described above, the support member 41 is rotated at the third position P3 by a set angle; thus, the fore and aft direction of the support member 41 located at the second position P2 crosses, or intersects, the first moving direction X at the set angle whereas the right and left direction of the support member 41 located at the second position P2 crosses, or intersects, the width direction Y at the set angle.

As shown in FIGS. 8-11, the second receiving member 44 includes a third positioning portion 63 for properly positioning a small container 1a supported by the second receiving member 44 in a third supporting area T3 as seen along the vertical direction, and a fourth positioning portion 64 for properly positioning a large container 1b supported by the second receiving member 44 in a fourth supporting area T4 as seen along the vertical direction. The fourth supporting area T4 is defined such that a portion thereof overlaps with the third supporting area T3. In addition, when the support member 41 is located at the second position P2, the first supporting area T1 and the third supporting area T3 coincide with each other whereas the second supporting area T2 and the fourth supporting area T4 coincide with each other.

The third positioning portion 63 includes third support members 65 and third engaging members 66.

Provided as the third support members 65 are two sets of third support members 65 with the two sets spaced apart from each other along the fore and aft direction of the support member 41 (which would have coincided with the first moving direction X if there was no rotation of the support member 41 at the third position P3), and with each set including two third support members 65 that are spaced apart from each other along the right and left direction of the support member 41 (which would have coincided with the width direction Y if there was no rotation of the support member 41 at the third position P3). And a small container 1a is supported from below by the two sets of the third support members 65 (i.e., total of four third support members 65). A third pin 67 is fixed to project upwardly from each third support member 65 of the pair of the third support members 65, of the two sets of the third support members 65, that are located on the front side along the fore and aft direction of the support member 41 (i.e., the first direction X1 side along the first moving direction X if there was no rotation of the support member 41 at the third position P3). These two third pins 67 are located in the third supporting area T3. And the two third pins 67 are for engaging from below the two front side first engaged portions 11f of a small container 1a when supporting the small container 1a with the second receiving member 44, and function as a pair of third engaging members 66 for engaging the pair of the front side first engaged portions 11f from below.

The third positioning portion 63 is configured to be able to support a small container 1a with the small container 1a properly positioned in the third supporting area T3 by supporting the small container 1a from below by means of the third support members 65 with the two third engaging members 66 engaging the two front side first engaged portions 11f of the small container 1a.

The fourth positioning portion 64 includes fourth support members 68, a fourth engaging member 69, and second contact members 70.

Three second restricting support members 71 are fixed to the second receiving member 44. These second restricting support members 71 are located outside the third supporting area T3, and each functions as a fourth support member 68 and a second contact member 70 as described below. Three second restricting support members 71 are provided, namely, a second restricting support member 71 located on one side along the right and left direction of the support member 41 with respect to the third supporting area T3, a second restricting support member 71 located on the other side along the right and left direction of the support member 41 with respect to the third supporting area T3, and a second restricting support member 71 located on the back side along the fore and aft direction of the support member 41 with respect to the third supporting area T3. In the description below, the expression, the "pair of second restricting support members", refers to the second restricting support member 71 located on one side along the right and left direction of the support member 41 with respect to the third supporting area T3 together with the second restricting support member 71 located on the other side along the right and left direction of the support member 41 with respect to the third supporting area T3.

And each member of the three second restricting support members 71 is formed in a shape of a two-step stair. The portion, of each of the second restricting support members 71, that forms the lower step functions as the fourth support member 68 which supports from below a large container 1b located in the fourth supporting area T4. In addition, portions, of the pair of second restricting support members 71, that form the upper steps function as the second contact members 70 that contact, from right and left (which would have coincided with the width direction Y if there was no rotation of the support member 41 at the third position P3), the large container 1b located in the fourth supporting area T4. Incidentally, the portions, of the second restricting support members 71, that form the lower steps are located inward (i.e. on the side in which the second reference position S2 of the supported large container 1b is located) along the right and left direction of the support member 41 with respect to the portions that form the upper steps.

When a large container 1b is supported in the fourth supporting area T4 by the second receiving member 44, the pair of second restricting support members 71 are located forward of the second reference position S2 along the fore and aft direction of the support member 41. Thus, the pair of second restricting support members 71 are provided to support, from below, portions of the large container 1b that are located in a forward area along the fore and aft direction and in the both end areas along the right and left direction. In addition, the pair of second restricting support members 71 are provided to contact the large container 1b from both sides along the right and left direction of the support member 41 (which would have coincided with the width direction Y if there was no rotation of the support member 41 at the third position P3) at locations forward of the back side second engaged portion 12r along the fore and aft direction of the support member 41.

Incidentally, the portions that form the lower steps of the pair of second restricting support members 71 also function as members that contact a small container 1a located in the third supporting area T3 from right and left along the right and left direction of the support member 41 (which would have coincided with the width direction Y if there was no rotation of the support member 41 at the third position P3).

A single fourth pin 72 is fixed to the second receiving member 44 so as to project upwardly from the second receiving member 44. And this fourth pin 72 is located outside the third supporting area T3 and is located inside the fourth supporting area T4. And when supporting a large container 1b with the second receiving member 44, the fourth pin 72 supports the large container 1b by engaging, from below, the back side second engaged portion 12r of the large container 1b, and functions as a fourth support member 68 which supports the large container 1b from below and as a fourth engaging member 69 which engages the second engaged portion 12.

The fourth positioning portion 64 is configured to be able to support a large container 1b with the large container 1b properly positioned in the fourth supporting area T4, by supporting the large container 1b from below by means of the fourth support members 68 (the single fourth pin 72 and the pair of second restricting support members 71) with the fourth engaging member 69 engaging the back side second engaged portion 12r of the large container 1b and with the second restricting support members 71 in contact with the large container 1b from right and left.

As shown in FIG. 5, the positional relationship between the first supporting area T1 and the second supporting area T2 is set such that the first reference position S1 of a small container 1a located in the first supporting area T1 is displaced in the first direction X1 from, or with respect to, the second reference position S2 of a large container 1b located in the second supporting area T2. By displacing the first supporting area T1 in the first direction X1 with respect to the second supporting area T2, the second pin 60 can be located outside the first supporting area T1 and displaced in the second direction X2 along the first moving direction X; and, a small container 1a would be displaced in the first direction X1 on the second receiving member 44 when the small container 1a is unloaded onto the second receiving member 44.

The first receiving member 43 is described next.

Figure 13:
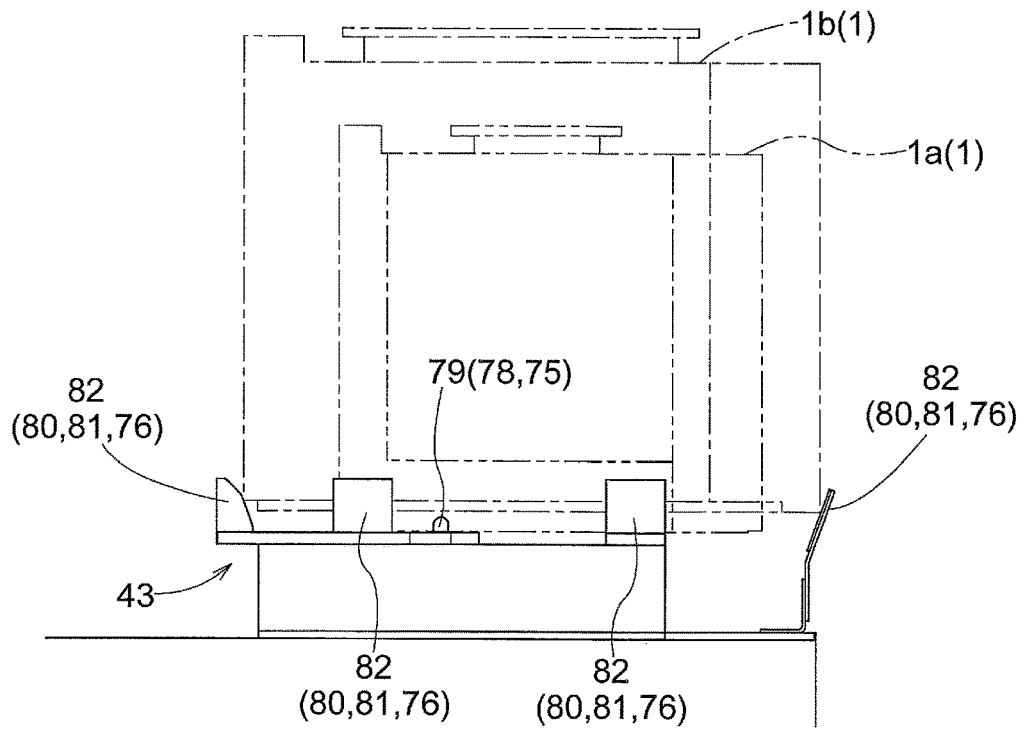
FIG. 13 is a side view of the first receiving member.
Figure 14:
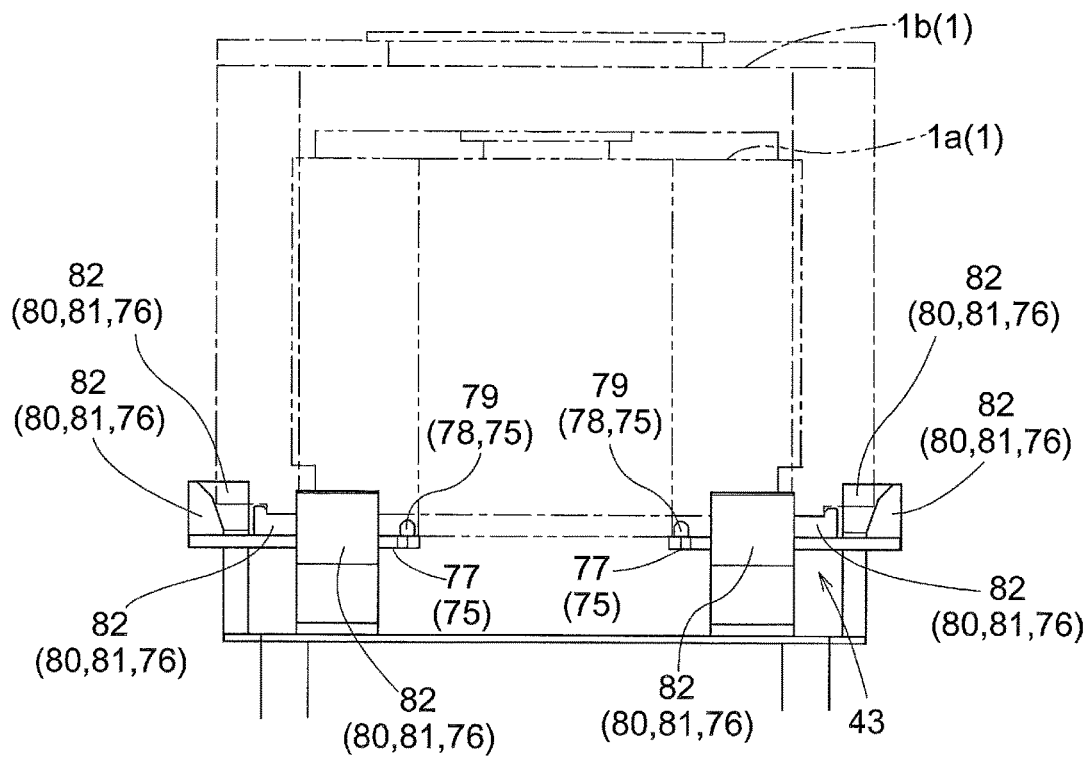
FIG. 14 is a rear view of the first receiving member.

As shown in FIGS. 12-14, the first receiving member 43 includes a fifth positioning portion 75 for properly positioning a small container 1a supported by the first receiving member 43 in a fifth supporting area T5 as seen along the vertical direction, and a sixth positioning portion 76 for properly positioning a large container 1b supported by the first receiving member 43 in a sixth supporting area T6 as seen along the vertical direction. The sixth supporting area T6 is defined such that a portion thereof overlaps with the fifth supporting area T5.

Incidentally, the fifth supporting area T5 is an area in which the bottom surface of a small container 1a properly positioned by the fifth positioning portion 75 exists whereas the sixth supporting area T6 is an area in which the bottom surface of a large container 1b properly positioned by the sixth positioning portion 76 exists.

Note that when the support member 41 is located at the position for small containers of the first position P1, the first supporting area T1 and the fifth supporting area T5 coincide with each other whereas, when the support member 41 is located at the position for large containers of the first position P1, the second supporting area T2 and the sixth supporting area T6 coincide with each other.

The fifth positioning portion 75 includes fifth support members 77 and fifth engaging members 78.

Provided as the fifth support members 77 are two sets of fifth support members 77 with the two sets spaced apart from each other along the first moving direction X and with each set including two fifth support members 77 that are spaced apart from each other along the width direction Y. And a small container 1a is supported from below by the two sets of the fifth support members 77 (i.e., total of four fifth support members 77). A fifth pin 79 is fixed to each member of the pair of the fifth support members 77 (of the two sets of fifth support members 77) that is located on the first direction X1 side along the first moving direction X, such that the fifth pin 79 projects upwardly from the corresponding fifth support member 77. These two fifth pins 79 are located in the fifth supporting area T5. And the two fifth pins 79 are for engaging from below the two front side first engaged portions 11f of a small container 1a when supporting the small container 1a with the first receiving member 43, and function as a pair of fifth engaging members 78 for engaging the pair of the front side first engaged portions 11f from below.

The fifth positioning portion 75 is configured to be able to support a small container 1a with the small container 1a properly positioned in the fifth supporting area T5 by supporting the small container 1a from below by means of the fifth support members 77 with the two fifth engaging members 78 engaging the two front side first engaged portions 11f of the small container 1a.

The sixth positioning portion 76 includes sixth support members 80 and third contact members 81.

Third restricting support members 82 are fixed to the first receiving member 43. These third restricting support members 82 are located outside the fifth supporting area T5, and function as the sixth support members 80 and the third contact members 81 as described below. A total of eight third restricting support members 82 are provided, namely, a pair of third restricting support members 82 located on one side along the width direction Y with respect to the fifth supporting area T5, a pair of third restricting support members 82 located on the other side along the width direction Y with respect to the fifth supporting area T5, a pair of third restricting support members 82 located on one side along the first moving direction X with respect to the fifth supporting area T5, and a pair of third restricting support members 82 located on the other side along the first moving direction X with respect to the fifth supporting area T5.

And, of the eight third restricting support members 82, the four located on either side along the width direction Y with respect to the supporting area T5 are formed in a shape of two-step stair. Portions, of the third restricting support members 82, that form the lower steps function as the sixth support members 80 which support from below a large container 1b located in the sixth supporting area T6. In addition, portions, of the third restricting support members 82, that form the upper steps function as the third contact members 81 that contact the large container 1b located in the sixth supporting area T6 from both sides along the first moving direction X or along the width direction Y. Incidentally, the portions, of the third restricting support members 82, that form the lower steps are located inward (i.e on the side in which the second reference position S2 of the supported large container 1b is located) along the first moving direction X or along the width direction Y with respect to the portions that form the upper steps.

And of the eight third restricting support members 82, each of the four remaining support members 82 (the four located on either side of the first moving direction X with respect to the fifth supporting area T5) has a sloped surface which contacts the large container 1b at an inwardly and upwardly tilted angle, and functions as a sixth support member 80 and a third contact member 81.

As such, the eight first restricting support members 59 are provided to support the peripheral portions of the large container 1b from below when the large container 1b is supported in the sixth supporting area T6 by the first receiving member 43. In addition, the eight third restricting support members 82 are provided to contact the large container 1b from both sides along the first moving direction X and from both sides along the width direction Y.

Incidentally, of the eight third restricting support members 82, portions of a pair of the third restricting support members 82 that form the lower steps also function as members that contact a small container 1a located in the fifth supporting area T5 from both sides along the width direction Y.

The sixth positioning portion 76 is configured to be able to support a large container 1b with the large container 1b properly positioned in the sixth supporting area T6, by supporting the large container 1b from below by means of the sixth support members 80 (the eight second restricting support members 71) with the third restricting support members 82 in contact with the large container 1b from both sides along the first moving direction X and from both sides along the width direction Y.

Figure 16:
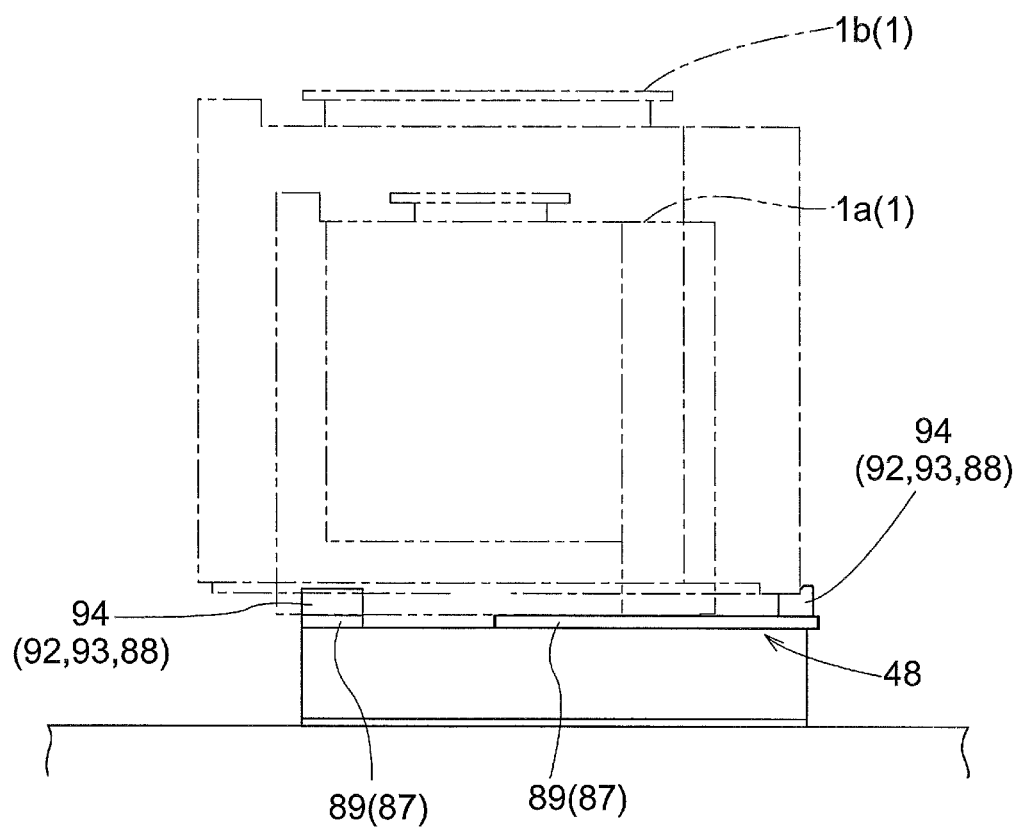
FIG. 16 is a side view of the third receiving member.

As shown in FIGS. 15 and 16, each of the one or more third receiving members 48 includes a seventh positioning portion 87 for properly positioning a small container 1a supported by the third receiving member 48 in a seventh supporting area as seen along the vertical direction, and an eighth positioning portion 88 for properly positioning a large container 1b supported by the third receiving member 48 in an eighth supporting area as seen along the vertical direction. The eighth supporting area is defined such that a portion thereof overlaps with the seventh supporting area.

Incidentally, the seventh supporting area is an area in which the bottom surface of a small container 1a properly positioned by the seventh positioning portion 87 exists whereas the eighth supporting area is an area in which the bottom surface of a large container 1b properly positioned by the eighth positioning portion 88 exists.

The seventh positioning portion 87 includes seventh support members 89 and seventh engaging members 90.

Two sets of the seventh support members 89 are provided as in the case of the fifth support members 77. And a small container 1a is supported from below by the two sets of the seventh support members 89 (i.e., total of four seventh support members 89). A seventh pin 91 is fixed to each member of the pair of the seventh support members 89 (of the two sets of seventh support members 89) that is located on the first direction X1 side along the first moving direction X, such that the seventh pin 91 projects upwardly from the corresponding seventh support member 89. These two seventh pins 91 are located in the seventh supporting area. And the two seventh pins 91 are for engaging from below the two front first engaged portions 11f of a small container 1a when supporting the small container 1a with the third receiving member 48, and function as a pair of seventh engaging members 90 for engaging the pair of the front side first engaged portions 11f from below.

The seventh positioning portion 87 is configured to be able to support a small container 1a with the small container 1a properly positioned in the seventh supporting area by supporting the small container 1a from below by means of the seventh support members 89 with the two seventh pins 90 engaging the two front side first engaged portions 11f of the small container 1a.

The eighth positioning portion 88 includes eighth support members 92 and fourth contact members 93.

Fourth restricting support members 94 are fixed to each of the one or more third receiving members 48. These fourth restricting support member 94 are located outside the seventh supporting area, and function as eighth support members 92 and fourth contact members 93 as described below. A total of four fourth restricting support members 94 are provided namely, a pair of fourth restricting support members 94 located on both sides along the width direction Y with respect to the seventh supporting area, and a pair of fourth restricting support members 94 located on the second direction X2 side along the first moving direction X with respect to the seventh supporting area.

And each member of the four fourth restricting support members 94 is formed in a shape of a two-step stair. Portions, of the fourth restricting support members 94, that form the lower steps function as the eighth support members 92 which support from below a large container 1b located in the eighth supporting area. In addition, portions, of the fourth restricting support members 94, that form the upper steps function as the fourth contact members 93 that contact the large container 1b located in the eighth supporting area from one side along the first moving direction X or from both sides along the width direction Y. Incidentally, the portions, of the fourth restricting support members 94, that form the lower steps are located inward (i.e. on the side in which the second reference position S2 of the supported large container 1b is located) along the first moving direction X or the width direction Y with respect to the portions that form the upper steps.

As such, the four fourth restricting support members 94 are provided to support the peripheral portions of the large container 1b from below when the large container 1b is supported in the eighth supporting area by the third receiving member 48. In addition, the four fourth restricting support members 94 are provided to contact the large container 1b from the second direction X2 side along the first moving direction X and from both sides along the width direction Y.

Incidentally, of the four fourth restricting support members 94, portions of a pair of the fourth restricting support members 94 that form the lower steps also function as members that contact a small container 1a located in the seventh supporting area from both sides along the width direction Y.

Thus, a small container 1a supported by the support member 41 is properly positioned in the first supporting area T1 by the first positioning portion 51, and a large container 1*b* supported by the support member 41 is properly positioned in the second supporting area T2 by the second positioning portion 52.

And the large container 1*b* supported by the support member 41 is supported by the second support members 56 of the second positioning portion 52 at a height at which the bottom surface of the large container 1*b* is located at a higher position than the upper ends of the first engaging members 54; thus, the large container 1*b* can be properly supported by the support member 41 without the large container 1*b* interfering with the first engaging members 54.

In addition, the large container 1*b* supported by the support member 41 can be properly positioned in the second supporting area T2 by virtue of the fact that the second engaging member 57 engages one of the three second engaged portions 12 of the large container 1*b* and the fact that the contact members 58 contact the large container 1*b* from right and left.

Thus, both a small container 1*a* and a large containers 1*b* can be properly supported by the support member 41.

Alternative Embodiments (1) In the embodiment described above, the first receiving member 43 is provided at the outside location 8 while the second receiving member 44 is provided at the inside location 9. However, it is not necessary to provide one or both of the first receiving member 43 and the second receiving member 44. And the container transport devices 4 may be arranged to directly transfer containers 1 to or from an outside transport device or a worker.

More specifically, for example, the first receiving member 43 may not have to be provided at the outside location 8 of the first container transport device 4*a*. And the ceiling transport vehicle 3 may unload a container 1 onto the support member 41 located at the first position P1.

(2) In the embodiment described above, each container transport device 4 performs only one of the transporting of the containers 1, one at a time, from the first receiving member 43 to the second receiving member 44 and the transporting of the containers 1, one at a time, from the second receiving member 44 to the first receiving member 43. However, one or more container transport devices 4 may perform both of the transporting of the containers 1 from the first receiving member 43 to the second receiving member 44, and the transporting of the containers 1 from the second receiving member 44 to the first receiving member 43.

(3) In the embodiment described above, the fourth engaging member 69 is provided at a position that is offset toward one side along the width direction Y with respect to the second reference position S2 of a large container 1*b* located in the fourth supporting area T4. However, the fourth engaging member 69 may be provided at a position located on an imaginary line that extends along the first moving direction X and that goes through the second reference position S2 of the large container 1*b* located in the fourth supporting area T4. As such, the fourth engaging member 69 may be provided to the fourth positioning portion 64 such that the container 1 is supported by the second receiving member 44 in an orientation in which the fore and aft direction of the container 1 coincides with the first moving direction X, as in the case of the first receiving member 43.

(4) In the embodiment described above, the position (position for small containers) at which the support member 41 is stopped when transferring a small container 1*a* between the support member 41 and the first receiving member 43 is different from the position (position for large containers) at which the support member 41 is stopped when transferring a large container 1*a* between the support member 41 and the first receiving member 43. However, these positions may be at the same position along the first moving direction X.

(5) In the embodiment described above, the support member 41 is configured to support the container 1 in an orientation in which the front side of the container 1 faces in the first direction X1. However, the support member 41 may be configured to support the container 1 in an orientation in which the front side of the container 1 faces in the second direction X2, or in an orientation in which the front side of the container 1 faces in one direction along the width direction Y.

(6) In the embodiment described above, the support member 41 includes three first engaging members 54 such that all three first engaged portions 11 of a small container 1*a* are engaged by the first engaging members 54 when supporting the small container 1*a* with the support member 41. However, the support member 41 may include only two first engaging members 54 such that two (e.g., the two front side first engaged portions 110 of the three first engaged portions 11 of a small container 1*a* are engaged by the first engaging members 54 when supporting the small container 1*a* with the support member 41.

(7) The structures, forms or arrangements of the members that support the container 1 and of the members that contact the side faces of the container 1 as shown in the aforementioned embodiments may be modified suitably. More specifically, in lieu of arranging the contact members 58 to contact the container 1 from right and left to restrict rotation of the container 1, the contact members 58 may be arranged to contact the container 1 from front and back to restrict the rotation of the container 1. In addition, three first pins 55 may be provided to support the small container 1*a* so that the first pins 55 function as the first support members 53.

(8) In the embodiment described above, the container transport device 4 is provided with the first moving mechanism 45 and the second moving mechanism 46 to move the support member 41 along both the first moving direction X and the second moving direction Z. However, in the case where the container 1 is directly transferred between the container transport device and an external transport device or a worker, or in a case where the first receiving member 43 and the second receiving member 44 are configured to be raised and lowered, the container transport device 4 may be provided only with the first moving mechanism 45 to move the support member 41 only along the first moving direction X.

(9) In the embodiment described above, the container transport device 4 is configured to transport a container 1 between the first receiving member 43 and the second receiving member 44 which are installed at the same height. However, the container transport device 4 may be a stacker crane or the raising-and-lowering transport device 2 in the aforementioned embodiment so that the container transport device 4 is configured to transport a container 1 between the first receiving member 43 and the second receiving member 44 that are installed at mutually different heights.

Incidentally, in the case where the container transport device 4 is a raising-and-lowering transport device 2, for example, the raised-and-lowered support member 19 may function as the support member and a storage support member 26 may function as the first receiving member so that a container 1 may be transported between the storage support member 26 and the second receiving member 44 by the container transport device 4. In addition, in the case where the container transport device 4 is a stacker crane, a shelf plate of an article storage rack may function as the first receiving member and a receiving platform provided at a storing-and-retrieving location may function as the second receiving member.

(10) In the embodiment described above, the containers 1 are FOUPs. However, the containers 1 may be other containers, such as FOSBs (Front Opening Shipping Box) used to transport between different factories.

[Summary of Embodiments Described Above]

Summary of the container transport device and the container transport facility described above is provided next.

A container transport device comprises: a support member for supporting from below a container for holding one or more semiconductor substrates; a moving mechanism for moving the support member; wherein the container is one of at least two kinds of containers that include a small container and a large container which is larger in size than the small container as seen along a vertical direction, wherein the small container includes three first engaged portions provided in a bottom surface of the small container with each first engaged portion having a shape of a groove, and wherein the large container includes three second engaged portions provided in a bottom surface of the large container with each second engaged portion having a shape of a groove, wherein each of the three first engaged portions is formed in the bottom surface of the small container such that a longitudinal direction thereof extends radially away from a first reference position on the bottom surface of the small container, wherein each of the three second engaged portions is formed in the bottom surface of the large container such that a longitudinal direction thereof extends radially away from a second reference position on the bottom surface of the large container, wherein each of separation distances between each of the three second engaged portions and the second reference position is greater than a greatest of separation distances between each of the three first engaged portions and the first reference position, wherein the support member includes a first positioning portion for properly positioning the small container supported by the support member in a first supporting area as seen along the vertical direction, and a second positioning portion for properly positioning the large container supported by the support member in a second supporting area as seen along the vertical direction, wherein the second supporting area is defined such that a portion thereof overlaps with the first supporting area, wherein the first positioning portion includes one or more first support members for supporting the small container from below, and first engaging members for engaging from below at least two of the three first engaged portions, wherein the second positioning portion includes one or more second support members for supporting the large container at a height at which the bottom surface of the large container is located at a higher position than upper ends of the first engaging members, and a second engaging member provided outside the first supporting area as seen along the vertical direction for engaging one of the three second engaged portions, and one or more contact members provided outside the first supporting area as seen along the vertical direction for contacting the large container located in the second supporting area from one or more directions that cross the vertical direction.

With the arrangement described above, the small container supported by the support member is properly positioned in the first supporting area by the first positioning portion as seen along the vertical direction and the large container supported by the support member is properly positioned in the second supporting area by the second positioning portion as seen along the vertical direction. Since the second supporting area is defined such that a portion thereof overlaps with the first supporting area, the support member can be made smaller compared with a case where the first supporting area and the second supporting area are arranged next to each other horizontally so as not to overlap with each other.

Because the small container supported by the support member is supported from below by the one or more first support members while the first engaging members engage at least two of the three first engaged portions of the small container, the small container can be supported by the support member with the small container properly positioned in the first supporting area.

And because the large container supported by the support member is supported by one or more second support members of the second positioning portion at a height at which the bottom surface of the large container is located at a higher position than the upper ends of the first engaging members, the large container can be properly supported by the support member without the large container interfering with, or coming into contact with, the first engaging members.

In addition, the large container supported by the support member can be properly positioned in the second supporting area by virtue of the fact that the second engaging member engages one of the three second engaged portions of the large container and the fact that the one or more contact members contact the large container from one or more directions that cross the vertical direction. Particularly, with the one or more contact members contacting the large container from one or more directions that cross the vertical direction, the large container can be restricted or prevented from rotating about a vertical axis centering on the second engaged portion.

And because the second engaging member is located outside the first supporting area, the second engaging member can be prevented from interfering with, or coming into contact with a small container when supporting the small container with the support member, allowing the small container to be properly supported by the support member.

Thus, both a small container and a large container can be properly supported by one support member designed to support both kinds of containers.

A container transport facility comprises: the container transport device; a first receiving member fixedly provided to support the container from below; a second receiving member fixedly provided to support the container from below; wherein the container transport device is configured to transport the container from the first receiving member to the second receiving member, or to transport the container from the second receiving member to the first receiving member.

With the arrangement described above, the container transport device unloads a container to a receiving member (the first receiving member or the second receiving member), and an external transport device or a worker transports the container unloaded to the receiving member to another location. Thus, the container transport device can unload the container and move on to the subsequent transport activity even if an external transport device or a worker is not standing by at a predetermined position to take away the container; so, containers can be more efficiently transported compared with a case where containers are transferred directly between the container transport device and an external transport device or a worker.

Here, the moving mechanism preferably includes a first moving mechanism for moving the support member along a first moving direction along a horizontal direction, and a second moving mechanism for moving the support member along a second moving direction along the vertical direction, wherein the first moving mechanism is preferably configured to move the support member to a first position at which the support member is located as seen along the vertical direction when transferring the container between the support member and the first receiving member by moving the support member along the second moving direction, and to a second position at which the support member is located as seen along the vertical direction when transferring the container between the support member and the second receiving member by moving the support member along the second moving direction wherein a positional relationship between the first supporting area and the second supporting area is preferably set to be such that the first reference position of the small container located in the first supporting area is displaced in a first direction with respect to the second reference position of the large container located in the second supporting area where the first direction is along the first moving direction and is a direction in which the second receiving member is located with respect to the first receiving member, and a second direction is an opposite direction of the first direction, wherein, preferably defined as the first position are a position for small containers which is a position of the support member when transferring the small container between the support member and the first receiving member, and a position for large containers which is a position of the support member when transferring the large container between the support member and the first receiving member, wherein the position for small containers is preferably set to be displaced in the second direction with respect to the position for large containers.

With the arrangement described above, the first reference position of the small container located in the first supporting area is set to be displaced in the first direction with respect to the second reference position of the large container located in the second supporting area. Thus, the small container is supported to be displaced in the first direction compared with a case where the first reference position and the second reference position are set to be located at the same position along the first moving direction. Therefore, when a container is transported to the second receiving member by the container transport device, a small container can be transferred with the small container displaced in the first direction so that it becomes easier for an external transport device or a worker to pick up the small container supported by the second receiving member from the first direction side.

In addition, the position for small containers which is a position of the support member when transferring a small container between the support member and the first receiving member is set to be displaced in the second direction with respect to the position for large containers which is a position of the support member when transferring a large container between the support member and the first receiving member. Thus, the position for small containers is set to be displaced in the second direction with respect to the position for large containers; so, when the container transport device unloads the container to the first receiving member, the small container can be unloaded with the small container displaced in the second direction compared with the position of the large container in spite of the fact that the small container is supported by the support member with the small container displaced in the first direction as described above. Therefore, it becomes easier for an external transport device or a worker to pick up the small container supported by the first receiving member from the second direction side.

In addition, an opening for taking one or more semiconductor substrates in and out of the container is formed in the container, wherein, with a portion of the container in which the opening is formed being defined as a front portion of the container; a portion of the container that is on an opposite side from the front portion being defined as a back portion of the container; a direction along which the front portion and the back portion are spaced apart from each other being defined as a fore and aft direction; and a direction that is perpendicular to the fore and aft direction as seen along the vertical direction being defined to be a right and left direction; the small container preferably includes, as the three first engaged portions, a pair of right and left front side first engaged portions located forward of the first reference position, and one back side first engaged portion located rearward of the first reference position and in a central portion along the right and left direction, wherein the large container preferably includes, as the three second engaged portions, a pair of right and left front side second engaged portions located forward of the second reference position, and one back side second engaged portion located rearward of the second reference position and in a central portion along the right and left direction, wherein the second engaging member preferably engages the back side second engaged portion when the support member supports the large container from below, wherein the moving mechanism preferably includes a first moving mechanism for moving the support member along a first moving direction along a horizontal direction, and a second moving mechanism for moving the support member along a second moving direction along the vertical direction, wherein the second receiving member preferably includes a third positioning portion for properly positioning the small container supported by the second receiving member in a third supporting area as seen along the vertical direction, and a fourth positioning portion for properly positioning the large container supported by the second receiving member in a fourth supporting area as seen along the vertical direction, wherein the fourth supporting area is preferably defined such that a portion thereof overlaps with the third supporting area, wherein the third positioning portion preferably includes third support members for supporting both end portions, along the right and left direction, of the small container from below, and a pair of third engaging members for engaging from below the pair of front side first engaged portions, wherein the fourth positioning portion preferably includes fourth support members for supporting the large container at a height at which the bottom surface of the large container is located at a higher position than upper ends of the third engaging members, by supporting both end portions, along the right and left direction, of the large container, a fourth engaging member for engaging the back side second engaged portion, and one or more second contact members provided at a position or positions outside the third supporting area as seen along the vertical direction for contacting from one or more sides of the large container located in the fourth supporting area, wherein the second receiving member preferably includes the fourth engaging member at a position that is offset toward one side along a direction that is perpendicular to the first moving direction as seen along the vertical direction with respect to the second reference position of the large container located in the fourth supporting area.

With the arrangement described above, the small container supported by the second receiving member is properly positioned in the third supporting area by the third positioning portion as seen along the vertical direction and the large container supported by the second receiving member is properly positioned in the fourth supporting area by the fourth positioning portion as seen along the vertical direction. Since the fourth supporting area is defined such that a portion thereof overlaps with the third supporting area, the second receiving member can be made smaller compared with a case where the third supporting area and the fourth supporting area are arranged next to each other horizontally so as not to overlap with each other.

As for a small container supported by the second receiving member, the both end portions, along the right and left direction, of the small container are supported by the third support members while the pair of third engaging members engage from below the pair of front side first engaged portions of the small container. Thus, the second receiving member can support the small container with the small container properly positioned in the third supporting area.

As for a large container supported by the second receiving member, the both end portions, along the right and left direction, of the large container are supported by the fourth support members while the fourth engaging member engages from below the back side second engaged portion of the large container. Thus, the second receiving member can support the large container with the large container properly positioned in the fourth supporting area.

And the fourth positioning portion includes the fourth engaging member at a position that is offset toward one side along a direction that is perpendicular to the first moving direction as seen along the vertical direction with respect to the second reference position of the large container located in the fourth supporting area. By locating the fourth engaging member at a position that is offset toward one side along a direction that is perpendicular to the first moving direction as seen along the vertical direction, it becomes easier to secure space into which a part of the container transport device, such as a moving mechanism, can be moved along the first moving direction, on the other side of the fourth engaging member along the direction perpendicular to the first moving direction.

What is claimed is:

1. A container transport device comprising:
   a support member for supporting from below a container for holding one or more semiconductor substrates;
   a moving mechanism for moving the support member;
   wherein the container is one of at least two kinds of containers that include a small container and a large container which is larger in size than the small container as seen along a vertical direction,
   wherein the small container includes three first engaged portions provided in a bottom surface of the small container with each first engaged portion having a shape of a groove, and wherein the large container includes three second engaged portions provided in a bottom surface of the large container with each second engaged portion having a shape of a groove,
   wherein each of the three first engaged portions is formed in the bottom surface of the small container such that a longitudinal direction thereof extends radially away from a first reference position on the bottom surface of the small container,
   wherein each of the three second engaged portions is formed in the bottom surface of the large container such that a longitudinal direction thereof extends radially away from a second reference position on the bottom surface of the large container,
   wherein each of separation distances between each of the three second engaged portions and the second reference position is greater than a greatest of separation distances between each of the three first engaged portions and the first reference position,
   wherein the support member includes a first positioning portion for positioning the small container supported by the support member in a first supporting area as seen along the vertical direction, and a second positioning portion for positioning the large container supported by the support member in a second supporting area as seen along the vertical direction,
   wherein the first positioning portion includes one or more first support members for supporting the small container from below, and first engaging members for engaging from below at least two of the three first engaged portions,
   wherein the one or more first support members and the first engaging members are located within a perimeter of the first supporting area,
   wherein the second positioning portion includes one or more second support members for supporting the large container at a height at which the bottom surface of the large container is located at a higher position than upper ends of the first engaging members, and a second engaging member located outside the perimeter of the first supporting area as seen along the vertical direction for engaging one of the three second engaged portions, and one or more contact members located outside the perimeter of the first supporting area as seen along the vertical direction for contacting the large container located in the second supporting area from one or more directions that cross the vertical direction, and
   wherein the one or more second support members and the second engaging member are located within a perimeter of the second supporting area.

2. A container transport facility comprising:
   the container transport device as defined in claim 1;
   a first receiving member fixedly provided to support the container from below;
   a second receiving member fixedly provided to support the container from below;
   wherein the container transport device is configured to transport the container from the first receiving member to the second receiving member, or to transport the container from the second receiving member to the first receiving member.

3. The article transport facility as defined in claim 2, wherein the moving mechanism includes a first moving mechanism for moving the support member along a first moving direction along a horizontal direction, and a second moving mechanism for moving the support member along a second moving direction along the vertical direction,
   wherein the first moving mechanism is configured to move the support member to a first position at which the support member is located as seen along the vertical direction when transferring the container between the support member and the first receiving member by moving the support member along the second moving direction, and to a second position at which the support member is located as seen along the vertical direction when transferring the container between the support member and the second receiving member by moving the support member along the second moving direction, wherein a positional relationship between the first supporting area and the second supporting area is set to be such that the first reference position of the small container located in the first supporting area is displaced in a first direction with respect to the second reference position of the large container located in the second supporting area where the first direction is along the first moving direction and is a direction in which the second receiving member is located with respect to the first receiving member, and a second direction is an opposite direction of the first direction, wherein, defined as the first position is a position for small containers which is a position of the support member when transferring the small container between the support member and the first receiving member, and a position for large containers which is a position of the support member when transferring the large container between the support member and the first receiving member, and wherein the position for small containers is set to be displaced in the second direction with respect to the position for large containers.

4. The article transport facility as defined in claim 2, wherein an opening for taking one or more semiconductor substrates in and out of the container is formed in the container, wherein, with a portion of the container in which the opening is formed being defined as a front portion of the container; a portion of the container that is on an opposite side from the front portion being defined as a back portion of the container; a direction along which the front portion and the back portion are spaced apart from each other being defined as a fore and aft direction; and a direction that is perpendicular to the fore and aft direction as seen along the vertical direction being defined to be a right and left direction;

the small container includes, as the three first engaged portions, a pair of right and left front side first engaged portions located forward of the first reference position, and one back side first engaged portion located rearward of the first reference position and in a central portion along the right and left direction, wherein the large container includes, as the three second engaged portions, a pair of right and left front side second engaged portions located forward of the second reference position, and one back side second engaged portion located rearward of the second reference position and in a central portion along the right and left direction, wherein the second engaging member engages the back side second engaged portion when the support member supports the large container from below, wherein the moving mechanism includes a first moving mechanism for moving the support member along a first moving direction along a horizontal direction, and a second moving mechanism for moving the support member along a second moving direction along the vertical direction, wherein the second receiving member includes a third positioning portion for positioning the small container supported by the second receiving member in a third supporting area as seen along the vertical direction, and a fourth positioning portion for positioning the large container supported by the second receiving member in a fourth supporting area as seen along the vertical direction, wherein the third positioning portion includes third support members for supporting both end portions, along the right and left direction, of the small container from below, and a pair of third engaging members for engaging from below the pair of front side first engaged portions, wherein the third support members and the pair of third engaging members are located within a perimeter of the third supporting area, wherein the fourth positioning portion includes fourth support members for supporting the large container at a height at which the bottom surface of the large container is located at a higher position than upper ends of the third engaging members, by supporting both end portions, along the right and left direction, of the large container, a fourth engaging member for engaging the back side second engaged portion, and one or more second contact members located at a position or positions outside the perimeter of the third supporting area as seen along the vertical direction for contacting from one or more sides of the large container located in the fourth supporting area, wherein the fourth support members and the fourth engaging member are located within a perimeter of the fourth supporting area, and wherein the second receiving member includes the fourth engaging member at a position that is offset toward one side along a direction that is perpendicular to the first moving direction as seen along the vertical direction with respect to the second reference position of the large container located in the fourth supporting area.

* * * * *